(12) United States Patent
Singh et al.

(10) Patent No.: US 12,044,732 B2
(45) Date of Patent: Jul. 23, 2024

(54) SILICON TEST STRUCTURES FOR SEPARATE MEASUREMENT OF NMOS AND PMOS TRANSISTOR DELAYS

(71) Applicant: NVIDIA Corporation, Santa Clara, CA (US)

(72) Inventors: Prashant Singh, San Jose, CA (US); Tezaswi Vatsavai Raja, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 445 days.

(21) Appl. No.: 17/494,614

(22) Filed: Oct. 5, 2021

(65) Prior Publication Data

US 2023/0104105 A1 Apr. 6, 2023

(51) Int. Cl.
   - *G01R 31/3183* (2006.01)
   - *G01R 31/28* (2006.01)
   - *G01R 31/317* (2006.01)
   - *H03K 3/03* (2006.01)
   - *H03L 7/099* (2006.01)

(52) U.S. Cl.
   CPC .. *G01R 31/318328* (2013.01); *G01R 31/2824* (2013.01); *G01R 31/31725* (2013.01); *H03K 3/0315* (2013.01); *H03L 7/0995* (2013.01)

(58) Field of Classification Search
   CPC ........ G01R 31/318328; G01R 31/2824; G01R 31/31725; G01R 31/2831; H03K 3/0315; H03L 7/0995
   See application file for complete search history.

(56) References Cited

U.S. PATENT DOCUMENTS

| | | | | |
|---|---|---|---|---|
| 9,007,133 | B2* | 4/2015 | Cremonesi | H03K 23/542 |
| | | | | 327/141 |
| 2009/0167396 | A1* | 7/2009 | Bosshart | H03K 19/0963 |
| | | | | 327/213 |
| 2010/0102891 | A1* | 4/2010 | Nissar | H03K 3/0315 |
| | | | | 331/57 |
| 2013/0037697 | A1* | 2/2013 | Kato | H03M 1/14 |
| | | | | 341/157 |

* cited by examiner

*Primary Examiner* — Jermele M Hollington
*Assistant Examiner* — Zannatul Ferdous
(74) *Attorney, Agent, or Firm* — Leydig, Voit & Mayer, Ltd.

(57) ABSTRACT

Silicon test structures are described that enable separate measurement of n-channel metal-oxide semiconductor (NMOS) and p-channel metal-oxide semiconductor (PMOS) transistor delays. NMOS and PMOS specific non-inverting stages may be used to construct a multi-stage ring oscillator. Each of the non-inverting stages generates either a rising or falling primary transition that is determined by either NMOS or PMOS transistors, respectively. The opposing transition for a particular non-inverting stage is triggered by propagation of the primary transition to a subsequent non-inverting stage (producing a "reset" pulse). A frequency of the ring oscillator is determined by the primary transition and one transistor type (NMOS or PMOS). Specifically, the frequency is determined by the propagation delay of the primary transition through the entire ring oscillator.

25 Claims, 17 Drawing Sheets

SILICON TEST STRUCTURES FOR SEPARATE MEASUREMENT OF NMOS AND PMOS TRANSISTOR DELAYS

BACKGROUND

In silicon monitors are used to identify the process corner of a given chip between slow, typical, and fast. However, conventional circuits average delays of rising and falling transitions, where p-channel metal-oxide semiconductor (PMOS) transistors typically determine the rising transitions and n-channel metal-oxide semiconductor (NMOS) transistors typically determine the falling transitions. Therefore, the conventional measurements do not provide separate delays for PMOS vs NMOS transistors. There is a need for addressing these issues and/or other issues associated with the prior art.

SUMMARY

Embodiments of the present disclosure relate to silicon test structures for separate measurement of NMOS and PMOS transistor delays. Systems and methods are disclosed for NMOS and PMOS specific non-inverting stages that may be used to construct a multi-stage ring oscillator. Each of the non-inverting stages generates either a rising or falling primary transition that is determined by either NMOS or PMOS transistors, respectively. The opposing transition for a particular non-inverting stage is triggered by propagation of the primary transition to a subsequent non-inverting stage (producing a "reset" pulse). A frequency of the ring oscillator is determined by the primary transition and one transistor type (NMOS or PMOS). Specifically, the frequency is determined by the propagation delay of the primary transition through the entire ring oscillator.

A conventional ring oscillator is constructed of inverting stages, with each inverting stage receiving an input transition that is either falling or rising and outputting a transition that is inverted, rising or falling, respectively. Therefore, a frequency of a conventional ring oscillator is determined by both rising and falling transitions and both NMOS and PMOS transistor types. In contrast, a ring oscillator for measuring NMOS transistor process-specific characteristics is constructed of non-inverting stages that are sensitive to NMOS transistor delays. A ring oscillator for measuring PMOS transistor process-specific characteristics is constructed of non-inverting stages that are sensitive to PMOS transistor delays.

In an embodiment, the method includes receiving a primary transition that is either rising or falling at a first non-inverting stage of a ring oscillator that includes the first non-inverting stage coupled in series with at least one additional non-inverting stage and propagating, by the first non-inverting stage, the primary transition from an output of the first non-inverting stage to the at least one additional non-inverting stage. In response to arrival of the primary transition at a downstream non-inverting stage included in the at least one additional non-inverting stage, a pulse is generated that causes the first non-inverting stage to generate an opposing transition at the output.

In an embodiment, a ring oscillator circuit comprises a plurality of non-inverting stages coupled in series to produce a signal having a frequency determined by only NMOS transistors or only PMOS transistors, where a primary transition that is either rising or falling is propagated through each non-inverting stage included in the plurality of non-inverting stages The ring oscillator circuit also comprises a plurality of reset stages that each cause an opposing transition at a corresponding non-inverting stage included in the plurality of non-inverting stages in response to the primary transition at a different non-inverting stage included in the plurality of non-inverting stages that is downstream relative to the corresponding non-inverting stage.

In an embodiment, a ring oscillator circuit comprises a first non-inverting stage coupled in series with a second and a third non-inverting stage to form a ring, where a primary transition at an output of the first non-inverting stage that is either rising or falling is propagated through each non-inverting stage in the ring and a reset stage that causes an opposing transition at the output in response to the primary transition at the second non-inverting stage.

In an embodiment, a ring oscillator circuit comprises a first non-inverting stage having an input and an output, a second non-inverting stage having an input coupled to the output of the first non-inverting stage and further having an output, a third non-inverting stage having an input coupled to the output of the second non-inverting stage and further having an output. The ring oscillator further comprises a reset stage coupled to cause an opposing transition at the output of the first non-inverting stage in response to a primary transition at the output of the second non-inverting stage.

BRIEF DESCRIPTION OF THE DRAWINGS

The present systems and methods for separate measurement of NMOS and PMOS transistor delays are described in detail below with reference to the attached drawing figures, wherein.

DETAILED DESCRIPTION

Systems and methods are disclosed related to silicon test structures for separate measurement of NMOS and PMOS transistor delays. In-silicon monitors are used to identify a process corner of silicon devices (e.g., integrated circuits or chips) during production. Examples of process corners include slow-slow, typical-typical, and fast-fast, where the first speed refers to carrier mobility of the NMOS transistors and the second speed refers to carrier mobility of the PMOS transistors. Additional skewed process corners that are more difficult to measure include slow-fast and fast-slow. Variations in transistor performance result from variations in the fabrication process that forms the transistors within a silicon wafer. A particular semiconductor device may be designed in terms of transistor strength, layout, and timing simulation, based on the worst-case of the various process corners. Therefore, accurate measurement of the process-specific characteristics, such as process corners and transistor performance is important in terms of device design and performance.

Conventional silicon test structures typically cannot isolate timing of the NMOS and PMOS transistors and are therefore unable to distinguish between cross process corners like SF, FS and TT. Identifying whether the NMOS and PMOS transistors are on or off performance targets is also important for silicon correlation and process binning. Conventional silicon test structures comprise skewed ring oscillators having a weak drive strength NMOS transistor stack followed by a strong drive strength PMOS transistor stack, causing the oscillation frequency of the skewed ring oscillator to be more sensitive to the falling transitions that are controlled by the NMOS transistors. However, there are multiple second order effects that are not clearly correlated with the SF/FS corners. The second order effects are particularly challenging due to shrinking process dimensions. The silicon test structures described herein, enable measurement of process-specific characteristics such as the SF, FS and TT process corners and also provide mechanisms for identifying if the NMOS and PMOS transistor performances are off target.

Figure 1A:
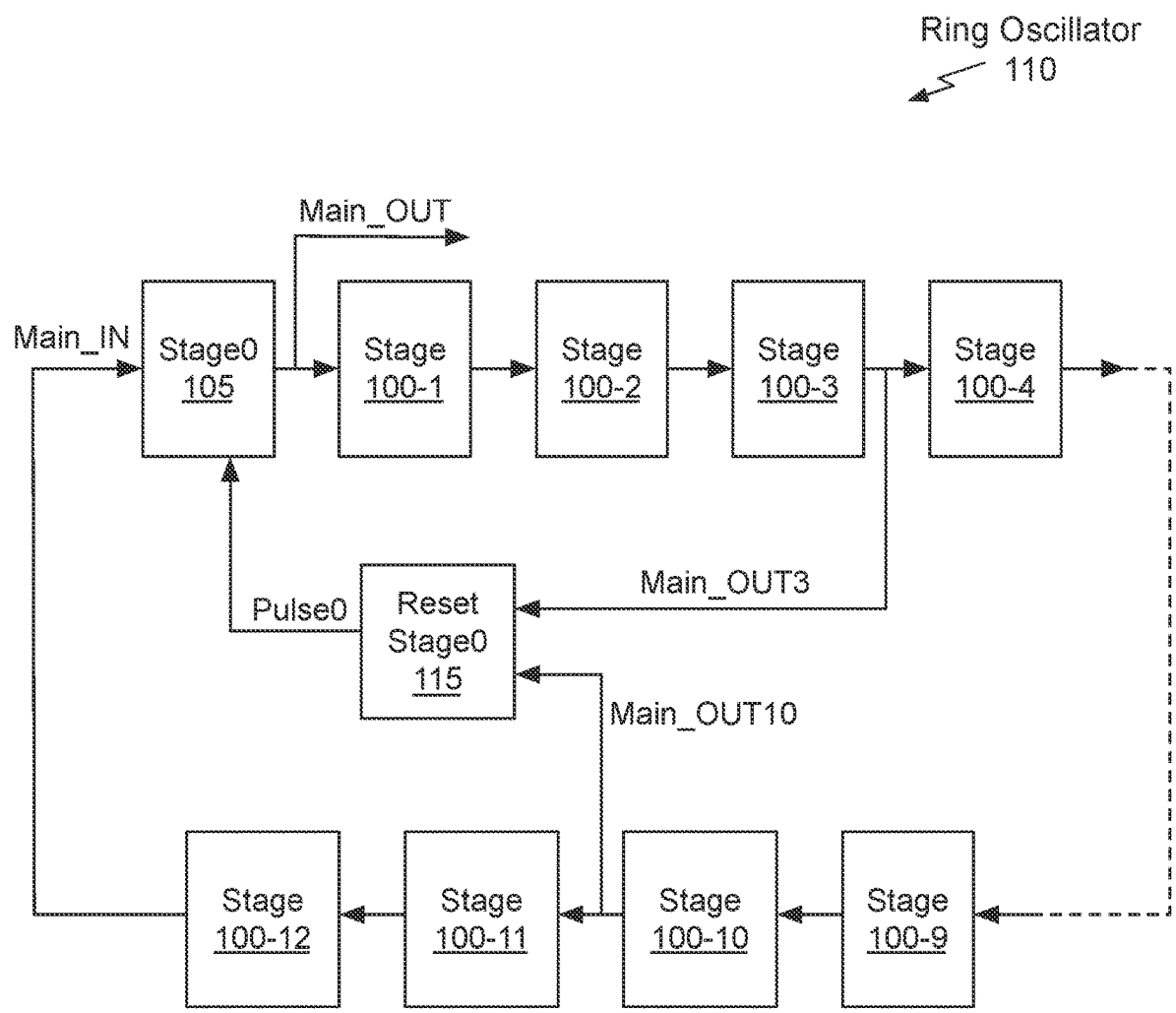
FIG. 1A illustrates a block diagram of an example ring oscillator suitable for use in implementing some embodiments of the present disclosure.

FIG. 1A illustrates a block diagram of an example ring oscillator 110 suitable for use in implementing some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the ring oscillator 110 is within the scope and spirit of embodiments of the present disclosure.

The ring oscillator 110 comprises multiple non-inverting stages including a stage0 105 and at least two stages 100-N coupled in series forming a ring. As shown if FIG. 1A, N=12. In other embodiments, N is another integer value that is greater than 1. In contrast with conventional ring oscillators that invert a signal at each stage, alternating between transitioning the signal low using NMOS transistors and transitioning the signal high using PMOS transistors, each stage in the ring oscillator 110 propagates the same transition of the signal. The timing delay incurred to propagate the transition through each and every stage is sensitive to only one type of transistor, either NMOS or PMOS. Ensuring that only one type of transistor controls the transition at each stage magnifies the effect of any mismatch for the one type of transistor.

In order to oscillate, each stage of the ring oscillator 110 also must complete an opposing transition between each primary transition. In the context of the following description, the primary transition is rising when each stage 100-N and 105 is sensitive to the NMOS transistor type (the opposing transition is falling). In the context of the following description, the primary transition is falling when each stage 100-N and 105 is sensitive to the PMOS transistor type (the opposing transition is rising). To best isolate the performance of PMOS transistors from NMOS transistors, the opposing transitions should not determine a frequency of the ring oscillator 110. Instead, the primary transitions determine the frequency, and therefore the frequency corresponds to one transistor type. In contrast, a frequency of a conventional ring oscillator more closely corresponds to an average of both transistor types.

During operation, the frequency of the ring oscillator 110 may be measured at an output of the stage0 105, main_OUT. In other embodiment, the frequency is measured at an output of one of the stages 100-N. A primary transition at an input to the stage0 105, main_IN propagates through the stage0 105 to produce a primary transition of main_OUT. The primary transition then propagates to each of the following stages 100-N causing primary transitions at each stage 100-N output in sequence. An opposing transition at the input main_IN is produced in response to the propagation of the primary transition to a particular one of the stages 100-N.

The primary transition of main_OUT is propagated to cause a primary transition at an output of the stage 100-3, producing a primary transition of main_OUT3. In response to the primary transition of main_OUT3 that is an input to the reset stage0 115, the pulse0 output is asserted. Assertion of the pulse0 input to the stage0 105 causes an opposing transition of main_OUT. In other words, assertion of the pulse0 causes main_OUT to toggle from a first logic level to a second logic level. In response to the assertion of the pulse0 the stage0 105 drives the main_OUT from the first logic level to the second logic level. In contrast with the primary transition that propagates through the sequence of stages 100-N, toggling the output at each stage 100-N in sequence, the opposing transition does not propagate through the sequence of stages 100-N. Instead, the opposing transition at each stage 100-N is caused by assertion of a pulse signal (not shown) provided to each stage 100-N. Assertion of pulse0 and each additional pulse signal operates as a "reset" to prepare the stage0 105 and stages 100-N to propagate another primary transition.

After pulse0 is asserted, the primary transition (ahead of the opposing transition) continues to propagate through the sequence of stages 100-N eventually causing a primary transition at an output of the stage 100-10, main_OUT10. The pulse0 remains asserted while the primary transition propagates to the stage 100-10. In response to the primary transition of main_OUT10 that is also an input to the reset stage0 115, the pulse0 output is negated (e.g., toggles or changes from asserted to negated).

In the context of the following description, the pulse0 is asserted when a primary transition occurs at a first input to the reset stage0 115 (e.g., main_OUT3) and the pulse0 is negated when a primary transition occurs at a second input to the reset stage0 115 (e.g., main_OUT10). In another embodiment, the first and second inputs are provided by different non-inverting stages 100-N, namely non-inverting stage 100-M and non-inverting 100-M+K, where M and K are integers and M+K<N. In response to negation of the pulse0 the stage0 105 releases the drive of main_OUT to prepare for the next primary transition. When pulse0 is negated, main_OUT is no longer actively driven and therefore, the logic level at main_OUT is unchanged until the primary transition propagates to main_IN and main_OUT is actively driven by the stage0 105 to a different logic level (i.e., toggled).

In an embodiment, after pulse0 is negated, leakage of the charge main_OUT is minimized to ensure that main_OUT does not transition until the primary transition is received at main_IN (after propagating through stages 100-11 and 100-12). Therefore, pulse0 should be negated before the primary transition of main_OUT10 propagates to the output of the stage 100-12, causing another primary transition of main_IN. The frequency of the ring oscillator 110 is determined by the primary transitions through the sequence of stages 105 and 100. Although only a single reset stage0 115 unit is shown in FIG. 1A, each stage 100-N is coupled to a corresponding reset stage (not shown) to produce the opposing transitions at the output of each stage 100-N.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
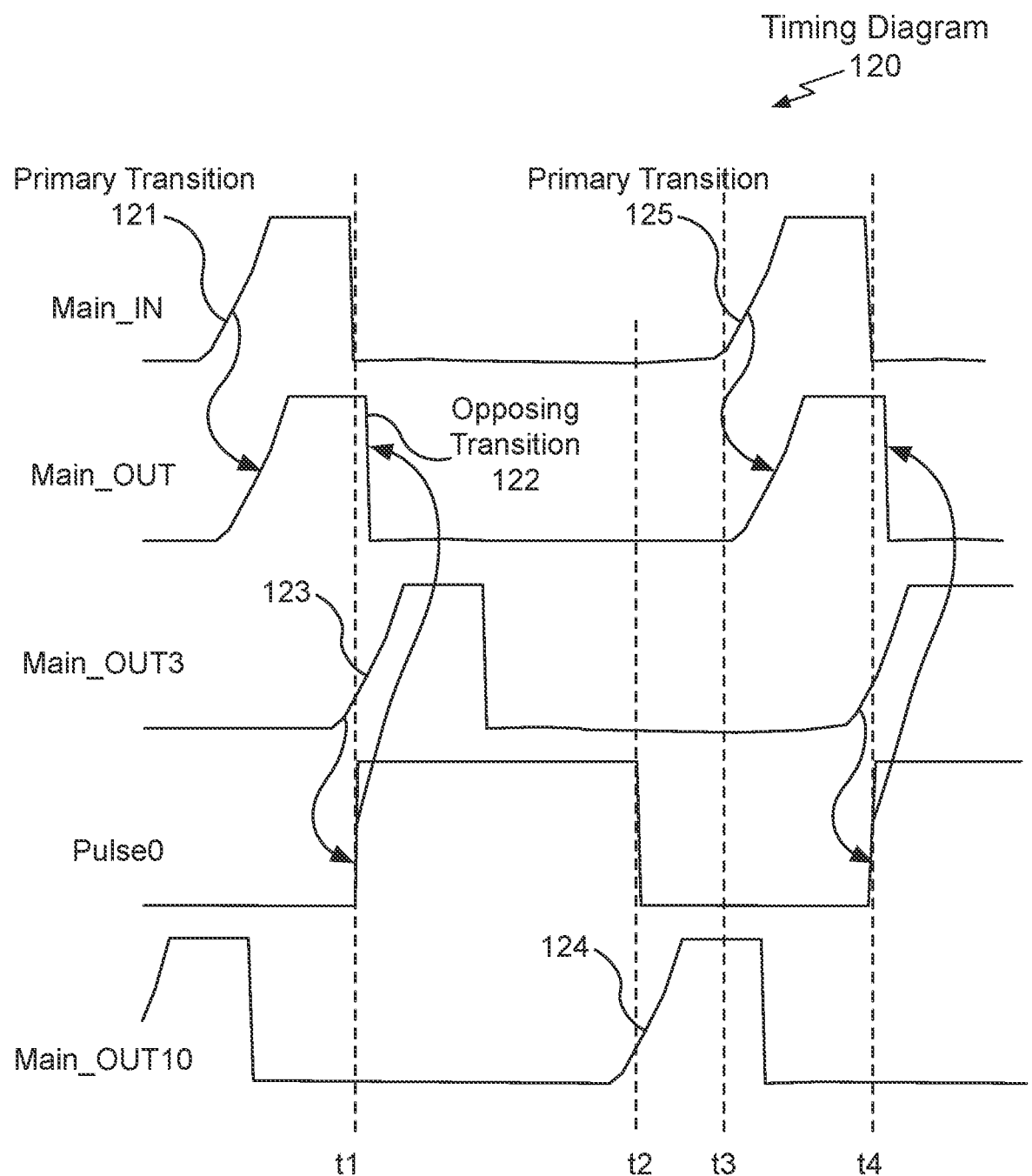
FIG. 1B illustrates a timing diagram of a non-inverting stage suitable for use in implementing some embodiments of the present disclosure.

FIG. 1B illustrates a timing diagram 120 of non-inverting stages 105 and 100-10 suitable for use in implementing some embodiments of the present disclosure. The timing diagram 120 corresponds to an NMOS transistor dominant ring oscillator 110 that is configured to measure die-specific delays for NMOS transistors. A primary transition 121 is received at input main_IN. The primary transition 121 is propagated through the non-inverting stage 105 to produce a primary transition at main_OUT. The primary transition 121 continues to propagate through the non-inverting stages 100-1, 100-2, and 100-3 in the ring oscillator 110, producing a primary transition 123 at main_OUT3 of the non-inverting stage 100-3. The primary transition 123 causes the reset stage0 155 to assert pulse0 at time t1. Assertion of pulse0 causes the non-inverting stage 105 to transition main_OUT from a first logic level (high or TRUE) to a second logic level (low or FALSE), producing an opposing transition 122 (toggling) at main_OUT. Importantly, main_OUT is not driven from the first logic level to the second logic level in response to the opposing transition at main_IN.

As shown in FIG. 1A, main_IN is coupled to the output of stage 100-12, main_OUT12. An opposing transition is driven to main_OUT12 and main_IN just before time t1 in response to stage 100-12 receiving a reset pulse 12 (not shown). In contrast with main_OUT, main_IN is not driven from the first logic level to the second logic level in response to assertion of pulse0. While the opposing transitions occur in response to the pulse0, primary transitions at main_IN are propagated to main_OUT by the non-inverting stages 105 and then through each subsequent stage 100-N, incurring a propagation delay through each non-inverting stage 105 and 100-N. Thus, the primary transition 121 is propagated through each non-inverting stage 105 and 100-N, but the opposing transition 122 is not propagated through each non-inverting stage 105 and 100-N.

The primary transition 121 continues to propagate from main_OUT3 to the non-inverting stages 100-4 through 100-10 in the ring oscillator 110, eventually producing a primary transition 124 at main_OUT10 of the non-inverting stage 100-10. The primary transition 124 causes the reset stage0 155 to negate pulse0 at time t2. Negation of pulse0 causes the non-inverting stage 105 to release driving main_OUT to the second logic level. The time duration between t1 and t2 corresponds to the propagation delay resulting from NMOS transistors from the main_OUT3 of non-inverting stage 100-3 through the non-inverting stages 100-4 to 100-10. At time t3, a primary transition at the main_OUT12 output of the non-inverting stage 100-12 is a next primary transition 125 at main_IN. At time t4, the primary transition 125 has propagated through the non-inverting stage 100-3 to assert pulse0. A period of the ring oscillator 110 may be measured as the time duration between adjacent primary transitions at main_OUT.

A frequency (or period) of a conventional ring oscillator is determined by rising edges controlled by PMOS transistors and falling edges controlled by NMOS transistors. In contrast, for the non-inverting stage0 105 and stages 100-N either the primary edge determines the frequency of the ring oscillator 110. For the PMOS transistor dominated non-inverting stage0 105 and stages 100-N, the frequency is determined by the falling edge of main_OUT and for the NMOS transistor dominated non-inverting stage0 105 and stages 100-N, the frequency is determined by the rising edge of main_OUT.

TABLE 1 below compares the sensitivity of the ring oscillator 110 (proposed RO) test structure against conventionally skewed ring oscillators using ND4 and NR4 NMOS transistor and PMOS transistor stacks, respectively.

TABLE 1

Ring oscillator period measurements

| | Normalized RO Period wrt TT | | |
| --- | --- | --- | --- |
| RO type | FS | TT | SF |
| Proposed RO (NMOS sensitive) | 0.72 | 1.00 | 1.56 |
| ND4 (stack of 4 NMOS) | 0.98 | 1.00 | 1.04 |
| Proposed RO (PMOS sensitive) | 1.69 | 1.00 | 0.68 |
| NR4 (stack of 4 PMOS) | 1.10 | 1.00 | 0.94 |

A value of 1.0 corresponds to a period of the ring oscillator at the TT process corner, so that lower values have a shorter (faster) period and higher than 1.0 values have a longer (slower) period. FS corresponds to a fast NMOS and slow PMOS process corner and SF corresponds to a slow NMOS and fast PMOS process corner. Comparing the FS process corner for the NMOS transistor dominant ring oscillator 110 and the conventional ND4 structure, the NMOS transistor dominant ring oscillator 110 has period that is much shorter (0.72 compared with 0.98). Therefore, the FS process corner indicates that the NMOS transistors are faster compared measured performance of the FS process corner for the conventional ND4 structure. The conventional ND4 structure does not isolate the NMOS transistors for measurement of the process corners, so the measurement is less accurate compared with measurement of the same process corner for the NMOS transistor dominant ring oscillator 110. The sensitivity to NMOS transistor speed is also indicated by the SF corner measurements where the NMOS transistor dominant ring oscillator 110 has a much slower period compared with the same process corner for the conventional ND4 structure (1.56 compared with 1.04).

Similarly, the measured SF process corner of the PMOS transistor dominant ring oscillator 110 has period that is much shorter compared with the same process corner for the conventional NR4 structure (0.68 compared with 0.94). The measured FS process corner of the PMOS transistor dominant ring oscillator 110 has period that is much longer compared with the same process corner for the conventional NR4 structure (1.69 compared with 1.10). The conventional NR4 structure does not isolate the PMOS transistors for measurement of the process corners, so the measurement is less accurate compared with measurement of the same process corner for the PMOS transistor dominant ring oscillator 110. Accurate measurements may enable reduction of timing margins for simulation, more reliable binning, and post-silicon debug.

Figure 1C:
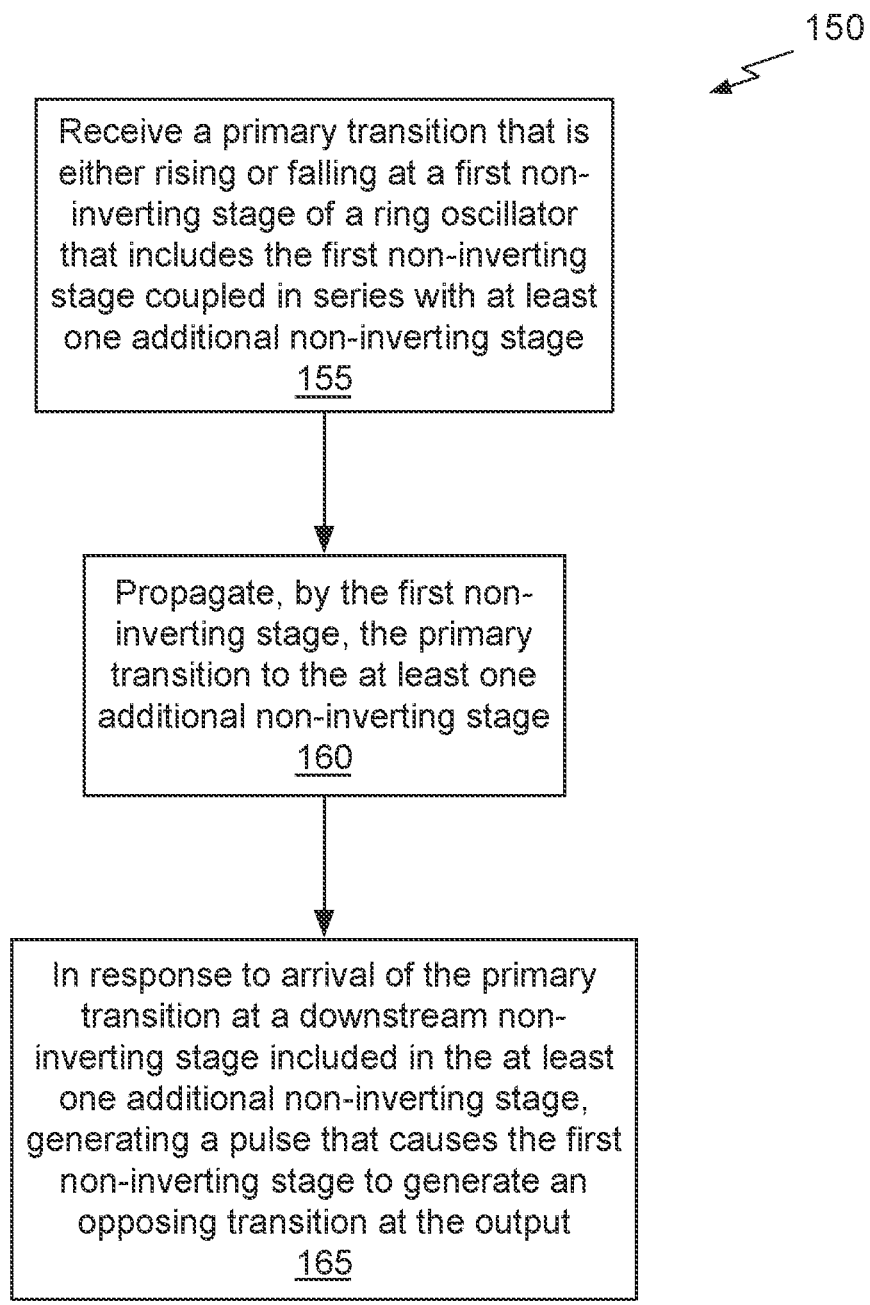
FIG. 1C illustrates a flowchart of a method for propagating non-inverting transitions, in accordance with an embodiment.

FIG. 1C illustrates a flowchart of a method 150 for propagating non-inverting transitions, in accordance with an embodiment. Each block of method 150, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 150 is described, by way of example, with respect to the ring oscillator 110 of FIG. 1A. However, this method may additionally or alternatively be executed by any one system, or any combination of systems, including, but not limited to, those described herein. Furthermore, persons of ordinary skill in the art will understand that any system that performs method 150 is within the scope and spirit of embodiments of the present disclosure.

At step 155, a primary transition that is either rising or falling is received at a first non-inverting stage of a ring oscillator that includes the first non-inverting stage coupled in series with at least one additional non-inverting stage. In an embodiment, the first non-inverting stage comprises the non-inverting stage0 105 and the at least one additional non-inverting stage comprises the non-inverting stages 100-N. In an embodiment, the primary transition is a rising transition having a duration that is determined by only NMOS transistors. In an embodiment, the primary transition is a falling transition having a duration that is determined by only PMOS transistors. In an embodiment, upon startup, an enable signal initiates the primary transition at the first non-inverting stage of the ring oscillator.

At step 160, the primary transition is propagated, by the first non-inverting stage, to the at least one additional non-inverting stage. In an embodiment, a number of the at least one additional non-inverting stage is even. In an embodiment, a number of the at least one additional non-inverting stage is odd.

At step 165, in response to arrival of the primary transition at a non-inverting stage included in the at least one additional non-inverting stage, a pulse is generated that causes the first non-inverting stage to generate an opposing transition at the output. In an embodiment, a frequency of the ring oscillator indicates a die-specific delay for either NMOS or PMOS transistors. In an embodiment, primary transitions received at an input of the first non-inverting stage are propagated from an input to the first non-inverting stage through the first non-inverting stage, causing a primary transition at an output of the first non-inverting stage. The primary transition is then propagated through the at least one additional non-inverting stage, but opposing transitions are not propagated through the first non-inverting stage and then through the at least one additional non-inverting stage. Instead, an opposing transition at the output of each additional non-inverting stage is generated in response to a (reset) pulse input to the additional non-inverting stage, where the pulse input is separate from the input to the additional non-inverting stage. In an embodiment, at least two additional non-inverting stages are needed to enable generation of the reset pulse inputs.

In an embodiment, a duration of the pulse is determined based on a propagation delay of the primary transition from the second non-inverting stage to a third non-inverting stage that is included in the at least one additional non-inverting stage. In an embodiment, the second non-inverting stage is the stage 100-3 and the third non-inverting stage is the stage 100-10. In an embodiment, the method 150 further comprises measuring a frequency of the primary transition at the output of the first non-inverting stage of the ring oscillator to compute process-specific characteristics for transistors fabricated within a die. In an embodiment, additional ring oscillators are included at additional locations within the die, and additional frequencies of primary transitions of the additional ring oscillators are measured to compute process-specific characteristics for transistors fabricated at the additional locations within the die. In an embodiment, the opposing transition comprises a transition from a first logic level to a second logic level and, in response to negation of the pulse, the second logic level is maintained until a subsequent primary transition is received at the input without actively driving the output to the second logic level. In an embodiment, the second logic level is maintained by minimizing leakage of charge from the output.

Figure 1D:
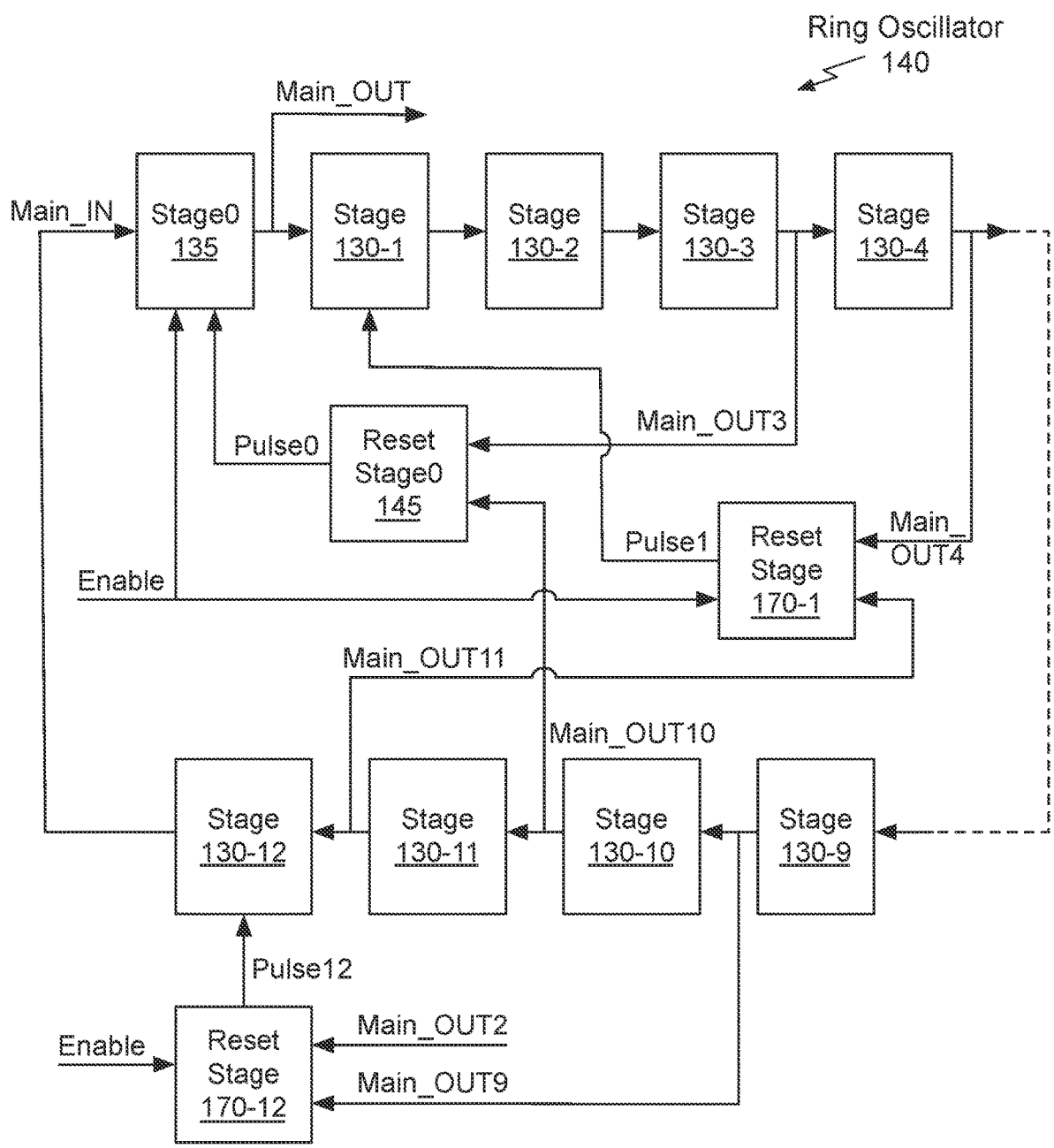
FIG. 1D illustrates a block diagram of another example ring oscillator suitable for use in implementing some embodiments of the present disclosure.

FIG. 1D illustrates a block diagram of another example ring oscillator 140 suitable for use in implementing some embodiments of the present disclosure. Compared with the ring oscillator 110 shown in FIG. 1A, the ring oscillator 140 includes an enable input to stage0 135 and each stage 130-N receives a pulse input (although the pulse input is only illustrated for the stage 130-1). Similar to the stage0 105 and the stages 100-N, the stage0 135 and the stages 130-N are non-inverting and are coupled in series forming a ring. Although only two reset stages 170-1 and 170-12 are shown in FIG. 1D, each stage 130-N is coupled to a corresponding reset stage 170-N(not shown) to produce the opposing transitions at the output of each stage 130-N.

To start operation of the ring oscillator 140, the enable signal is negated to prevent main_OUT from transitioning. When the stage0 135 is sensitive to NMOS transistor delays, main_OUT is asserted while enable is negated. When the stage0 135 is sensitive to PMOS transistor delays, main_OUT is negated while enable is negated. When enable is negated, pulse0 is also negated by the reset stage0 145 so that the level of main_OUT is controlled by the enable input to the stage0 135.

The subsequent stages 130-N do not include the enable input. Instead, the reset stages 170-N corresponding to the subsequent stages 130-N are different compared with the reset stage0 145 for the first stage0 135. The reset stage 170-N for each subsequent non-inverting stage 130-N asserts the "reset" pulseN when enable is negated or when enable is asserted and the primary transition is propagated to the output of stage 130-N+M. The reset pulseN is negated when the primary transition is propagated to the output of stage 130-N+M+K. As shown in FIG. 1D, M=3 and K=7, so that the reset stage 170-1 receives main_OUT4 and main_OUT11 as inputs and the reset stage 170-12 receives main_OUT2 and main_OUT9 as inputs.

When enable is negated, reset stages 170-N each assert the pulseN outputs to the non-inverting stages 130-N. In response to pulseN being asserted, main_OUT is negated for NMOS transistor dominant stages 130-N and main_OUT is asserted for PMOS transistor dominant stages 130-N. At startup, the enable is asserted to negate the pulseN inputs to each stage 130-N and propagation of the level of main_OUT at stage0 135 is initiated, causing a primary transition at the output of stage 130-1. The reset stage0 145 and reset stages 170-N each cause an opposing transition at an output of a corresponding non-inverting stage 135 and 130-N, in response to the primary transition at a different non-inverting stage 135 or 130-N that is downstream relative to the corresponding non-inverting stage 135 and 130-N. Specifically, propagation of a primary transition at main_OUT4 causes the reset stage 170-1 to assert pulse1 and, in response, an opposing transition is driven at the output of the non-inverting stage 130-1. In the context of the following description, stage 130-4 is downstream relative to the stage 130-1 because a primary transition is propagated from the output of the stage 130-1 to the output of the stage 130-4, causes the opposing transition at main_OUT4. Similarly, stage 130-2 is downstream relative to the stage 130-12 and stage 130-3 is downstream relative to the stage0 135.

It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the ring oscillator 140 is within the scope and spirit of embodiments of the present disclosure.

Figure 2A:
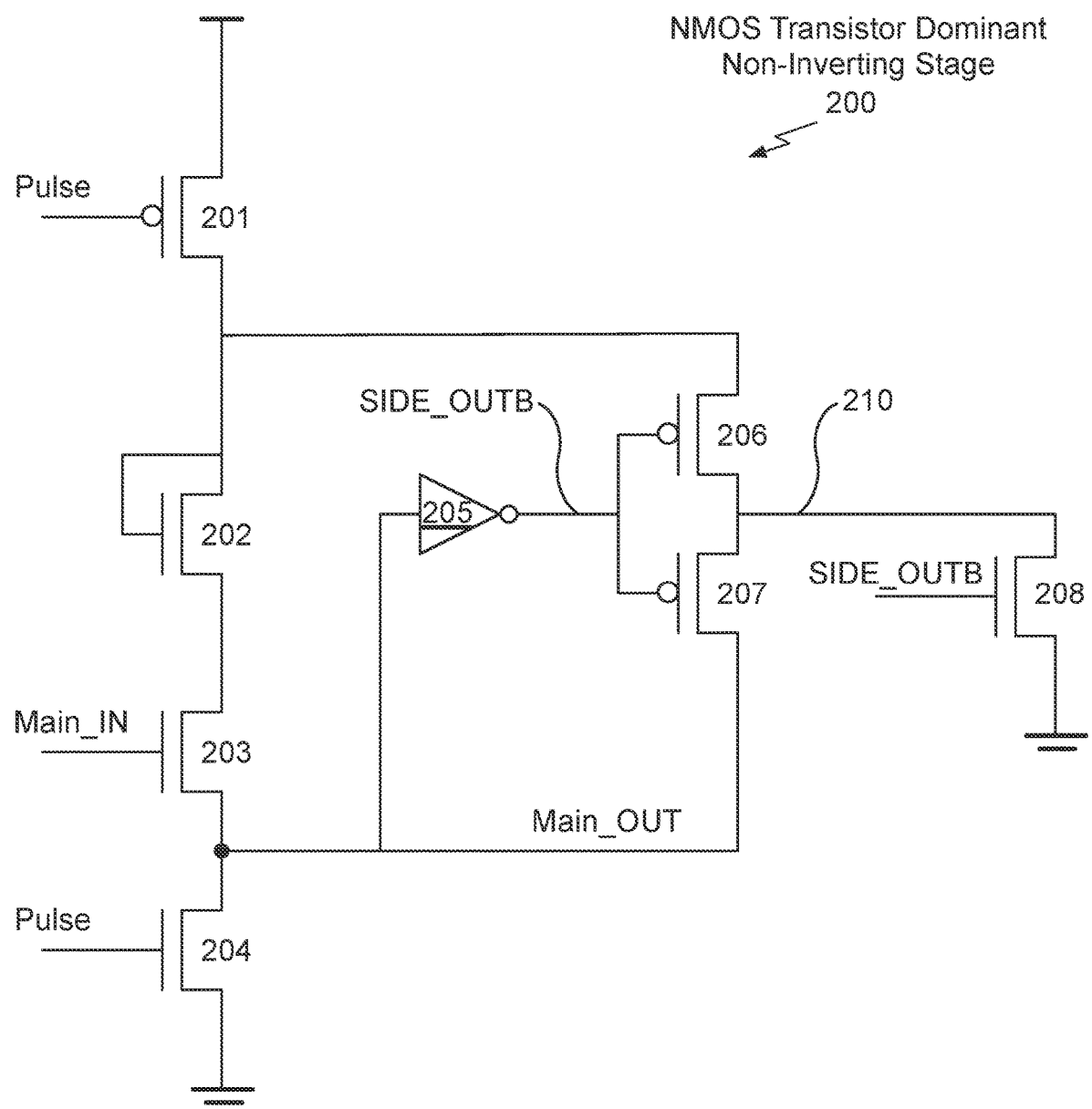
FIG. 2A illustrates a circuit diagram of a NMOS transistor dominant non-inverting stage suitable for use in implementing some embodiments of the present disclosure.

FIG. 2A illustrates a circuit diagram of a NMOS transistor dominant non-inverting stage 200 suitable for use in implementing some embodiments of the present disclosure. The NMOS transistor dominant non-inverting stage 200 is sensitive to NMOS transistor delays and may be used to implement the non-inverting stages 130-N. A stack of two NMOS transistors 202 and 203 cause a rising transition of main_OUT in response to a rising (primary) transition at main_IN. Sensitivity for measuring NMOS transistor performance is increased by coupling NMOS transistor 202 in series with the NMOS transistor 203 compared with using only the NMOS transistor 203. Note that a pulse input is at a logic low level when the rising transition occurs at main_IN (as shown in FIG. 1B), so PMOS transistor 201 is enabled and NMOS transistor 204 is disabled (e.g., not enabled, not activated). While the pulse input is at a logic low level, the transistor 201 effectively couples transistors 202 and 206 to VDD (logic high) and the transistor 204 effectively decouples transistors 203 and 207 from GND (logic low).

Because the NMOS transistors 202 and 203 can only pull the main_OUT output to VDD-Vt (a threshold voltage level Vt below the power supply voltage VDD), a keeper circuit is used to pull the main_OUT output to VDD. The keeper circuit comprises an inverter 205 and PMOS transistors 206 and 207. The inverter 205 generates an intermediate signal SIDE_OUTB that is pulled to a logic low level by an NMOS transistor in response to main_OUT being driven to a logic high level. Although the keeper circuit assists with a last portion of the primary transition, a contribution of the keeper circuit to the primary transition is of $2^{nd}$ order and relatively much smaller compared with the contribution of the NMOS transistors 202, 203 and hence the keeper circuit has minimal impact on the frequency of a ring oscillator constructed using the NMOS transistor dominant non-inverting stage 200. An NMOS transistor 208 is disabled while SIDE_OUTB is at a logic low level (and main_OUT is at a logic high level).

The main_OUT output remains at a logic high level until the pulse input is asserted. The pulse input operates to "reset" the NMOS transistor dominant non-inverting stage 200 for propagating the next primary transition. When the pulse input is asserted, the transistor 201 is disabled, effectively decoupling transistors 202 and 206 from VDD. When the pulse input is asserted, the transistor 204 is enabled, effectively coupling transistors 203 and 207 to GND. The main_OUT output is pulled to a logic low level by the NMOS transistor 204. In response to main_OUT being pulled low, the inverter 205 asserts the SIDE_OUTB signal, disabling the transistors 206 and 207. In response to the assertion of the SIDE_OUTB signal, the NMOS transistor 208 is enabled to pull a node 210 to a logic low level. The transistor 203 is disabled by an opposing transition at the main_IN input before the pulse input is negated.

As previously explained in conjunction with FIG. 1B, the pulse signal is negated before a next primary transition is received at the main_IN input. After the pulse signal is negated, main_OUT is not actively driven (e.g., pulled down) to a logic low level, but a "weak" logic low is maintained by ensuring that the charge at main_OUT does not leak away through the transistor 207 or transistors 203 and 202. The enabled NMOS transistor 208 minimizes leakage from the main_OUT to the node 210 through transistor 207 by pulling the node 210 down to a logic low level. Leakage through the transistors 203 and 202 is minimized because the two transistors are stacked. The main_OUT remains at the "weak" logic low until another primary transition occurs at main_IN, causing another primary transition at main_OUT. A frequency of a ring oscillator constructed of the NMOS transistor dominant non-inverting stage 200 is determined by the primary transitions through the NMOS transistor dominant non-inverting stages 200.

Figure 2B:
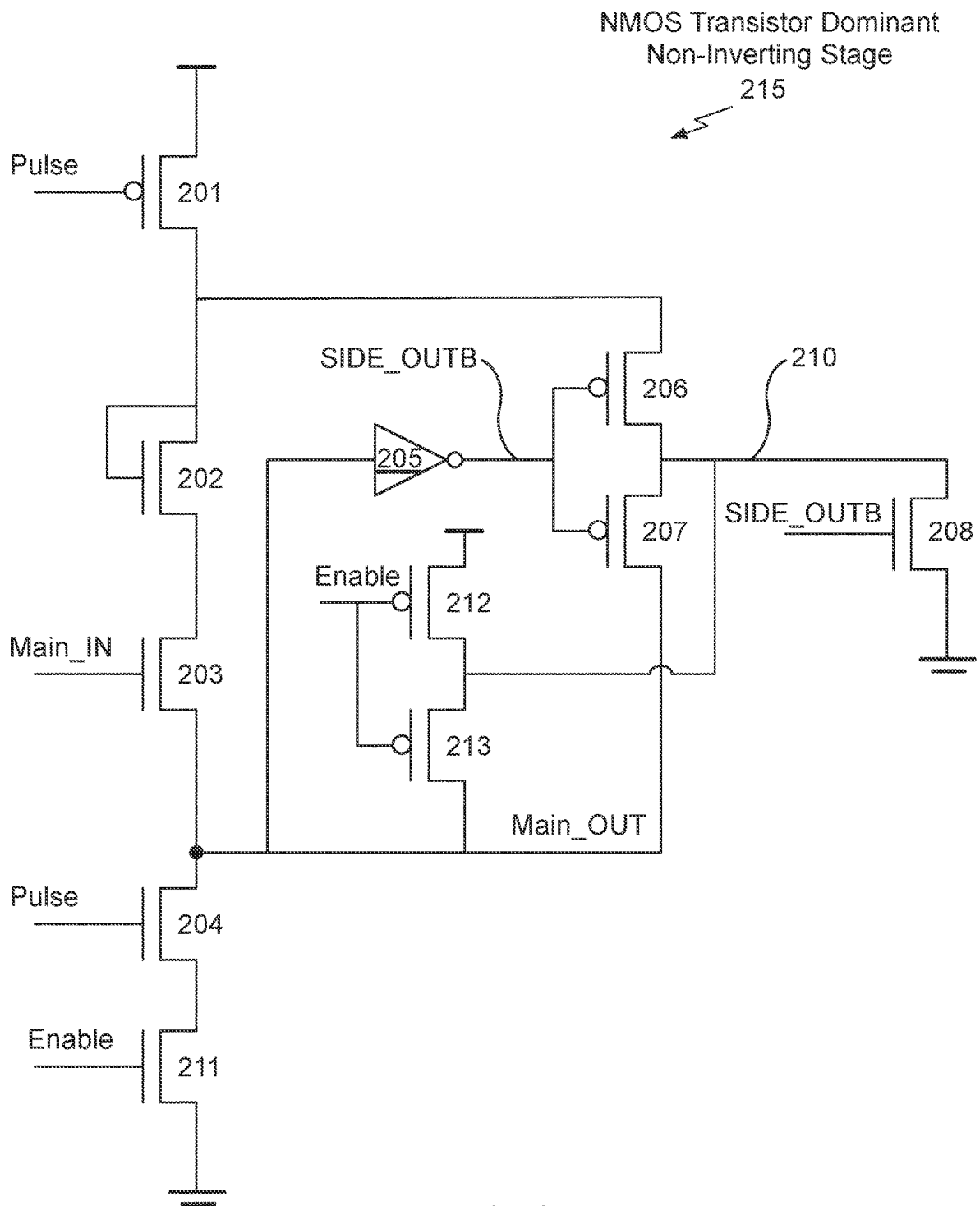
FIG. 2B illustrates a circuit diagram of another NMOS transistor dominant non-inverting stage suitable for use in implementing some embodiments of the present disclosure.

FIG. 2B illustrates another circuit diagram of a NMOS transistor dominant non-inverting stage 215 suitable for use in implementing some embodiments of the present disclosure. The NMOS transistor dominant non-inverting stage 215 is sensitive to NMOS transistor delays and includes an enable input. The NMOS transistor dominant non-inverting stage 215 may be used to implement the non-inverting stage0 135. In addition to the transistors included in the NMOS transistor dominant non-inverting stage 200, the NMOS transistor dominant non-inverting stage 215 includes the transistors 211, 212, and 213 that are each controlled by the enable signal. The transistor 211 decouples the transistor 204 from the GND supply when enable is negated and coupled the transistor 204 to the GND supply when enable is asserted. The transistors 212 and 213 drive main_OUT and the node 210 to a logic high level when enable is negated and are inactive when enable is asserted.

Figure 2C:
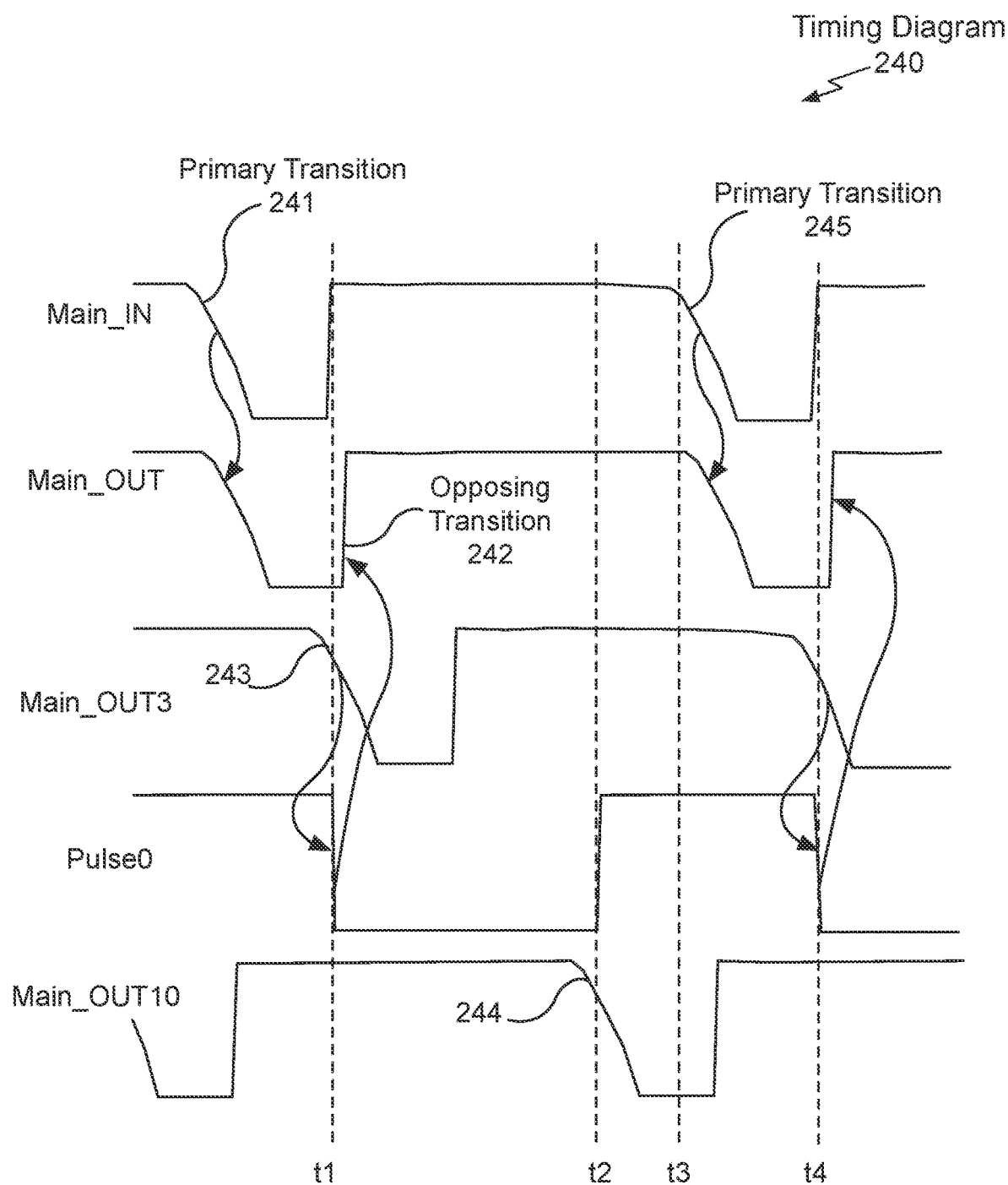
FIG. 2C illustrates another timing diagram of a non-inverting stage suitable for use in implementing some embodiments of the present disclosure.

FIG. 2C illustrates a timing diagram 240 of non-inverting stages 105 and 100-10 suitable for use in implementing some embodiments of the present disclosure. The timing diagram 240 corresponds to a ring oscillator 110 that is configured to measure die-specific delays for PMOS transistors. A primary (falling) transition 241 is received at input main_IN. The primary transition 241 is propagated through the non-inverting stage 105 to produce a primary transition at main_OUT. The primary transition 241 continues to propagate through the non-inverting stages 100-1, 100-2, and 100-3 in the ring oscillator 110, producing a primary transition 243 at main_OUT3 of the non-inverting stage 100-3. The primary transition 243 causes the reset stage0 155 to assert pulse0 at time t1. In contrast with the NMOS transistor dominant non-inverting stages 200 and 215, the pulse0 signal is asserted when the logic level is driven low for the PMOS transistor dominant non-inverting stages. Assertion of pulse0 causes the non-inverting stage 105 to transition main_OUT from the first logic level (low or FALSE) to the second logic level (high or TRUE), producing an opposing (rising) transition 242 (toggling) at main_OUT.

Importantly, main_OUT is not driven from the first logic level to the second logic level in response to the opposing transition at main_IN. In contrast, a primary transition at main_IN is propagated to main_OUT by the non-inverting stages 105 and 100-N. Thus, the primary transition 241 is propagated through each non-inverting stage 105 and 100-N, but the opposing transition 242 is not propagated through each non-inverting stage 105 and 100-N. The timing diagram 240 also represents the operation of the ring oscillator 140 where the non-inverting stage 135 replaces 105 and the non-inverting stages 130-N replace 100-N.

The primary transition 241 continues to propagate from main_OUT3 to the non-inverting stages 100-4 through 100-10 in the ring oscillator 110, eventually producing a primary transition 244 at main_OUT10 of the non-inverting stage 100-10. The primary transition 244 causes the reset stage0 155 to negate pulse0 at time t2. Negation of pulse0 causes the non-inverting stage 105 to release driving main_OUT to the second logic level. The time duration between t1 and t2 corresponds to the propagation delay resulting from PMOS transistors from the main_OUT3 of non-inverting stage 100-3 through the non-inverting stages 100-4 to 100-10. At time t3, a primary transition at the main_OUT12 output of the non-inverting stage 100-12 corresponds to a next primary transition 245 at main_IN. At time t4, the primary transition 245 has propagated through the non-inverting stage 100-3 to assert pulse0. A period of the ring oscillator 110 may be measured as the time duration between adjacent primary transitions at main_OUT.

Figure 2D:
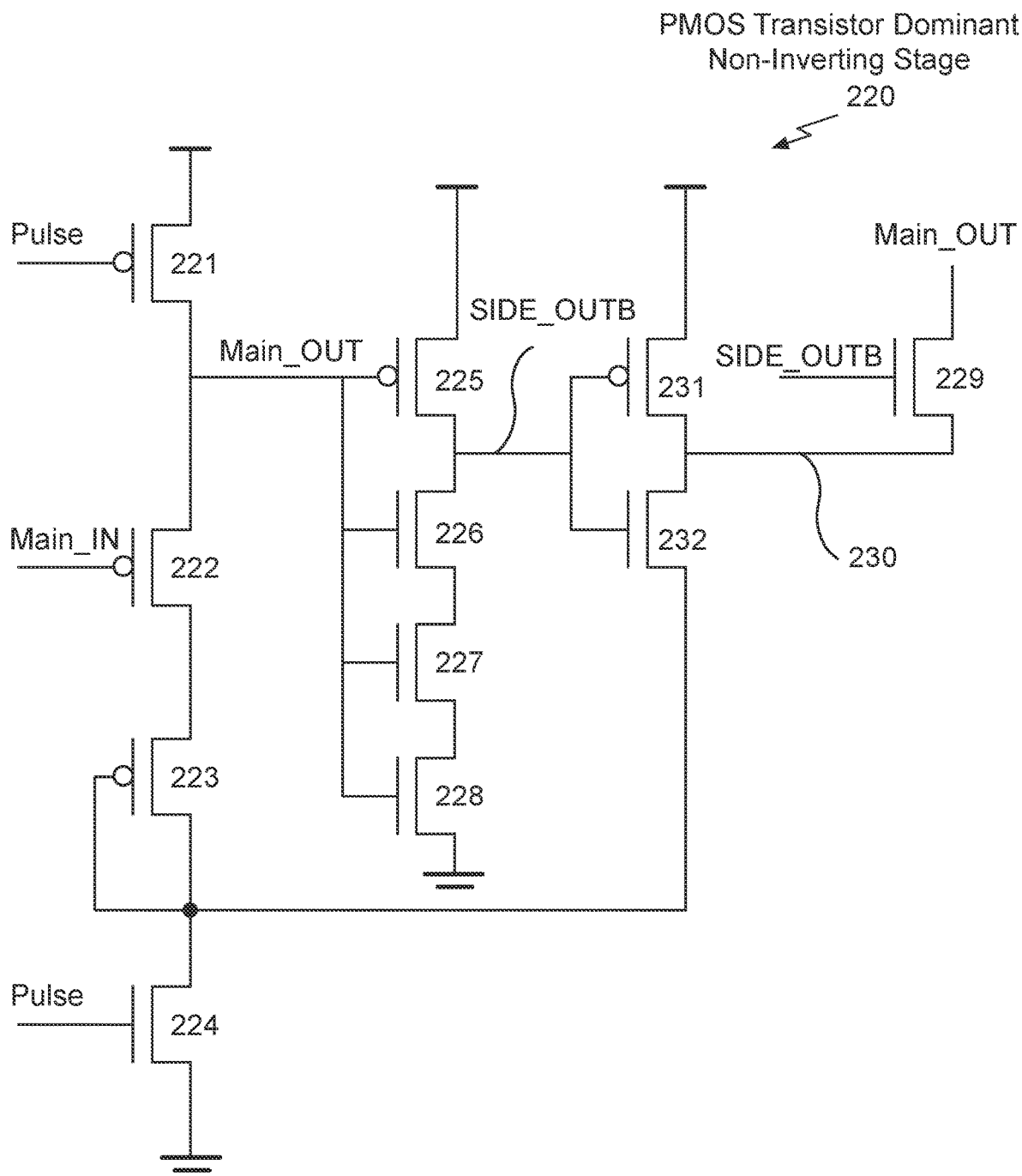
FIG. 2D illustrates a circuit diagram of a PMOS transistor dominant non-inverting stage suitable for use in implementing some embodiments of the present disclosure.

FIG. 2D illustrates a circuit diagram of a PMOS transistor dominant non-inverting stage 220 suitable for use in implementing some embodiments of the present disclosure. The PMOS transistor dominant non-inverting stage 220 is sensitive to PMOS transistor delays and may be used to implement the non-inverting stage 100-N or 130-N. A stack of two PMOS transistors 222 and 223 cause a falling transition of main_OUT in response to a falling (primary) transition at main_IN. Sensitivity for measuring PMOS transistor performance is increased by coupling PMOS transistor 222 in series with the PMOS transistor 223 compared with using only the PMOS transistor 222. Note that a pulse input is active low, meaning the pulse input is at a logic low level when the pulse input is asserted. Therefore, pulse is at a logic high level when the primary (falling) transition occurs at main_IN, so PMOS transistor 221 is disabled and NMOS transistor 224 is enabled. While the pulse input is at a logic high level, the transistor 221 decouples main_OUT and transistor 222 from VDD (logic high). While the pulse input is at the logic high level, the transistor 224 effectively couples transistors 223 and 232 to GND (logic low), enabling the PMOS transistor 223.

Because the PMOS transistors 222 and 223 can only pull the main_OUT output to GND+Vt (a threshold voltage level Vt above the ground supply voltage GND), a keeper circuit is used to pull the main_OUT output to GND. The keeper circuit comprises transistors 225, 226, 227, 228, and 229. While pulse is a logic high level, the transistors 231 and 232 operate as an inverter with SIDE_OUTB as an input. In response to main_IN being pulled down, main_OUT is pulled down and PMOS transistor 225 is enabled to pull the intermediate signal SIDE_OUTB to a logic high level. In response to the logic high level of SIDE_OUTB, the NMOS transistor 232 is enabled to pull node 230 down to a logic low level (the PMOS transistor is disabled). The NMOS transistor 229 is enabled by the logic high level of SIDE_OUTB and main_OUT is driven to a logic low level through the NMOS transistor 229. NMOS transistors 226, 227, and 228 are disabled when main_OUT is pulled down to the logic low level. Although the keeper circuit assists with a last portion of the primary transition, a contribution of the keeper circuit to the primary transition is of $2^{nd}$ order and relatively much smaller compared with the contribution of the PMOS transistors 222, 223 and hence the keeper circuit has minimal impact on the frequency of a ring oscillator constructed using the PMOS transistor dominant non-inverting stage 220.

The main_OUT output remains at a logic low level until the pulse input is asserted (pulseB is negated). The pulse input operates to "reset" the PMOS transistor dominant non-inverting stage 200 for propagating the next primary transition. When the pulse input is asserted, the transistor 201 is disabled, effectively decoupling transistors 202 and 206 from VDD. When the pulse input is asserted, the PMOS transistor 221 is enabled and NMOS transistor 224 is disabled. While the pulseB input is at a logic low level, the transistor 221 drives main_OUT up to a logic high level and effectively couples transistor 222 to VDD (logic high). While the pulseB input is at a logic low level, the transistor 224 effectively decouples transistors 223 and 232 from GND (logic low).

In response to main_OUT being pulled to a logic high level, the transistors 226, 227, and 228 are enabled and the transistor 225 is disabled, so that SIDE_OUTB is pulled to a logic low level. In response to SIDE_OUTB being pulled down, the transistor 231 is enabled to drive the node 230 to a logic high level. Transistor 232 is decoupled from GND and, as SIDE_OUTB is pulled down to a logic low level, transistor 232 is disabled. In response to negation of SIDE_OUTB, the NMOS transistor 229 is also disabled, decoupling node 230 from main_OUT. The transistor 222 is disabled by an opposing transition at the main_IN input before the pulse input is negated (deasserted).

As previously explained in conjunction with FIG. 2C, the pulse signal is negated before a next primary transition is received at the main_IN input. After the pulse signal is negated, main_OUT is not actively driven (e.g., pulled up) to a logic high level, but a "weak" logic high is maintained by ensuring that the charge at main_OUT does not leak away through the transistor 229 or transistors 222 and 223. The enabled PMOS transistor 231 minimizes leakage from the main_OUT to the node 230 through transistor 229 by pulling the node 230 up to a logic high level. Leakage through the transistors 222 and 223 is minimized because the two transistors are stacked. The main_OUT remains at the "weak" logic high until another primary transition occurs at main_IN, causing another primary transition at main_OUT. A frequency of a ring oscillator constructed of the PMOS transistor dominant non-inverting stage 200 is determined by the primary transitions through the PMOS transistor dominant non-inverting stage 200 stages.

Figure 2E:
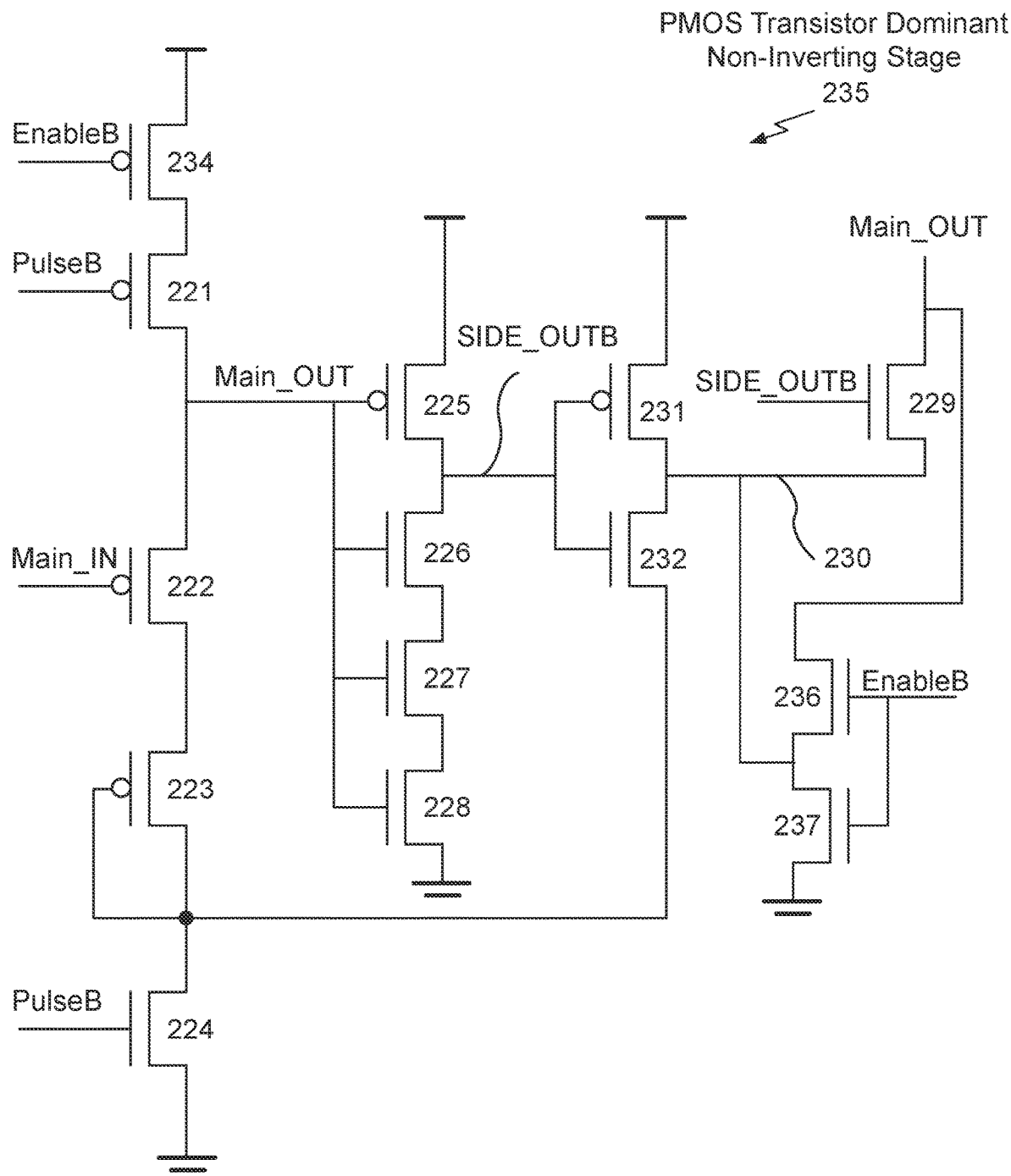
FIG. 2E illustrates a circuit diagram of another PMOS transistor dominant non-inverting stage suitable for use in implementing some embodiments of the present disclosure.

FIG. 2E illustrates a circuit diagram of another PMOS transistor dominant non-inverting stage 235 suitable for use in implementing some embodiments of the present disclosure. The PMOS transistor dominant non-inverting stage 235 is sensitive to PMOS transistor delays and includes an enable input. The PMOS transistor dominant non-inverting stage 235 may be used to implement the non-inverting stage0 135. In addition to the transistors included in the PMOS transistor dominant non-inverting stage 220, the PMOS transistor dominant non-inverting stage 235 includes the transistors 234, 236, and 237 that are each controlled by the enableB (inverted enable) signal. The transistor 234 decouples the transistor 221 from the VDD supply when enable is negated and couples the transistor 221 to the VDD supply when enable is asserted. The transistors 236 and 237 drive main_OUT and the node 230 to a logic low level when enable is negated and are inactive (disabled) when enable is asserted.

Figure 3A:
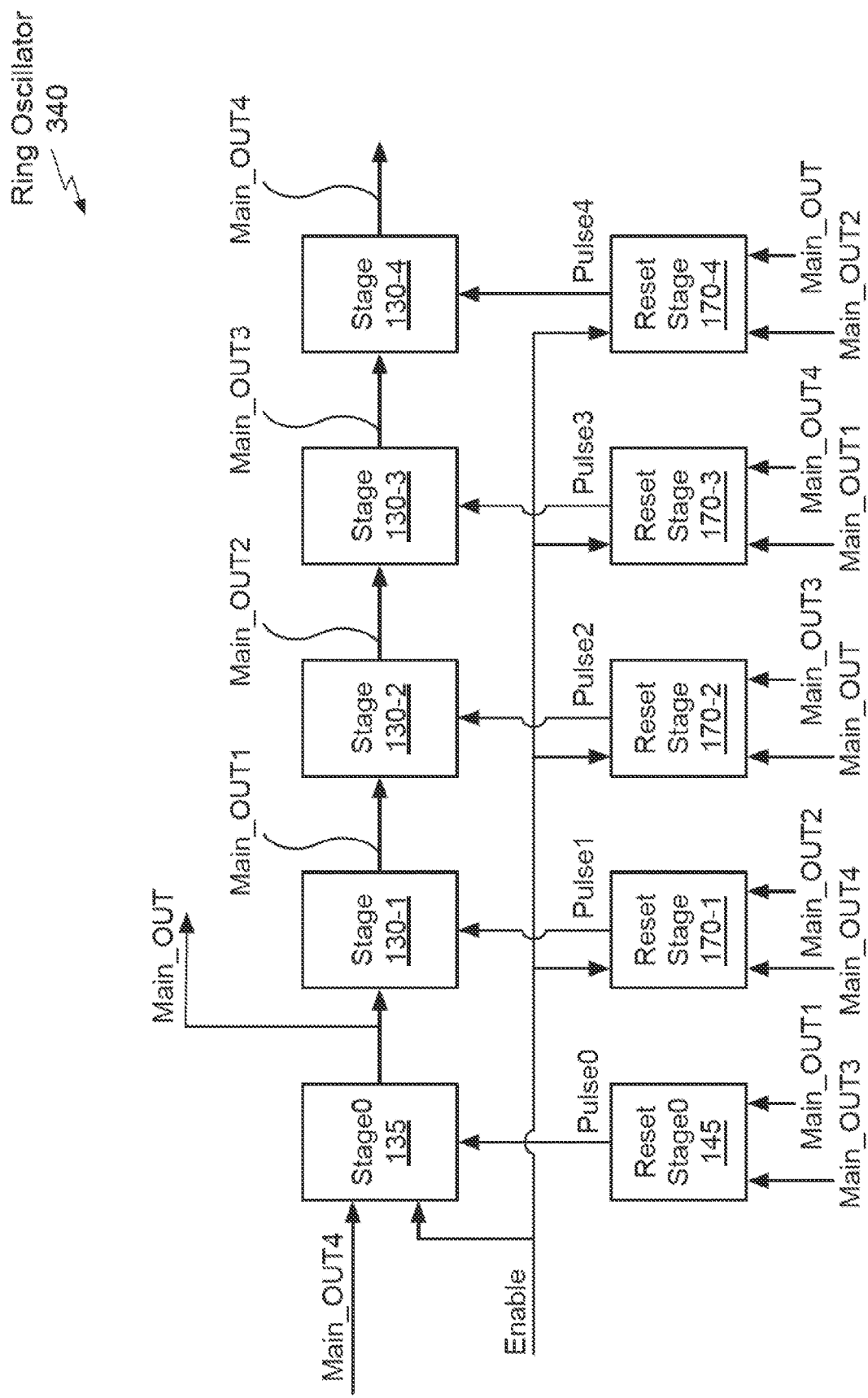
FIG. 3A illustrates a block diagram of another example ring oscillator suitable for use in implementing some embodiments of the present disclosure.

FIG. 3A illustrates a block diagram of another example ring oscillator 340 suitable for use in implementing some embodiments of the present disclosure. Compared with the ring oscillator 140 shown in FIG. 1D, the ring oscillator 340 includes N=4 stages 130. An output of the stage 130-4, main_OUT4 is an input to the stage0 135, forming a ring. As shown in FIG. 3A, each stage 130-N is coupled to a corresponding reset stage 170-N that generates a pulseN input to produce the opposing transitions at the output of each stage 130-N.

To start operation of the ring oscillator 340, the enable signal is negated to prevent main_OUT from transitioning. When the stage0 135 is sensitive to NMOS transistor delays, main_OUT is asserted while enable is negated. When the stage0 135 is sensitive to PMOS transistor delays, main_OUT is negated while enable is negated. When enable is negated, pulse0 is also negated by the reset stage0 145 so that the level of main_OUT is controlled by the enable input to the stage0 135.

The subsequent stages 130-N do not include the enable input. Instead, the reset stages 170-N corresponding to the subsequent stages 130-N are different compared with the reset stage0 145 for the first stage0 135. The reset stage 170-N for each subsequent non-inverting stage 130-N asserts the "reset" pulseN when enable is negated or when enable is asserted and the primary transition is propagated to the output of stage 130-N+M. The reset pulseN is negated when the primary transition is propagated to the output of stage 130-N+M+K. As shown in FIG. 3A, M=1 and K=2, so that the reset stage 170-1 receives main_OUT2 and main_OUT4 as inputs and the reset stage 170-4 receives main_OUT (e.g., main OUT0) and main_OUT2 as inputs.

When enable is negated, reset stages 170-N each assert the pulseN outputs to the non-inverting stages 130-N. In response to pulseN being asserted, main_OUT is negated for NMOS transistor dominant stages 130-N and main_OUT is asserted for PMOS transistor dominant stages 130-N. At startup, the enable is asserted to negate the pulseN inputs to each stage 130-N and propagation of the level of main_OUT at stage0 135 is initiated, causing a primary transition at the output of stage 130-1. The reset stage0 145 and reset stages 170-N each cause an opposing transition at an output of a corresponding non-inverting stage 135 and 130-N, in response to the primary transition at a different non-inverting stage 135 or 130-N that is downstream relative to the corresponding non-inverting stage 135 and 130-N.

Figure 3B:
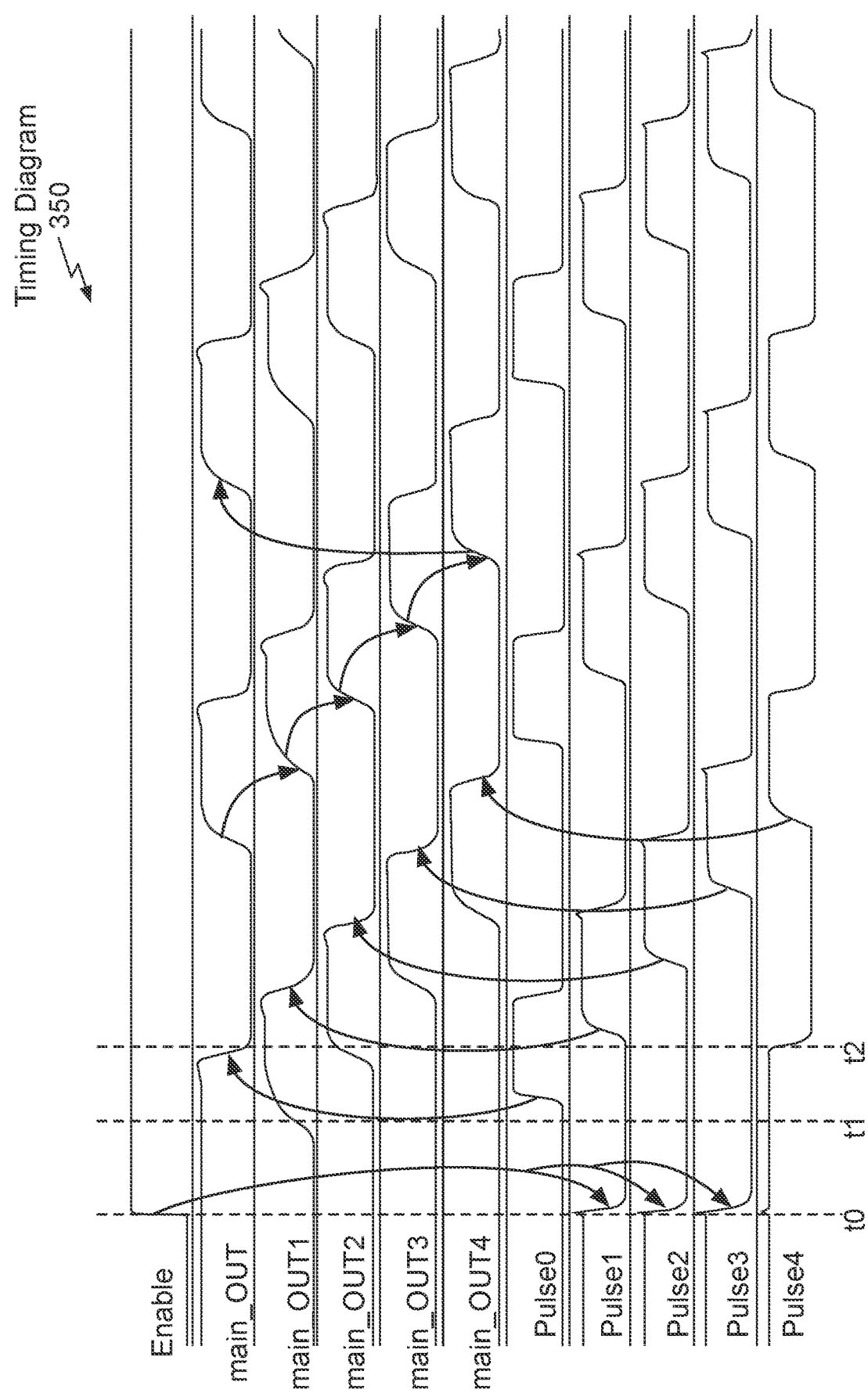
FIG. 3B illustrates a timing diagram of the example ring oscillator shown in FIG. 3A suitable for use in implementing some embodiments of the present disclosure.

FIG. 3B illustrates a timing diagram 350 of the example ring oscillator 340 shown in FIG. 3A suitable for use in implementing some embodiments of the present disclosure. The timing diagram 350 is for a ring oscillator 340 that is constructed of stages 130-N and stage0 135 that are sensitive to NMOS transistor delays. When enable is negated (enable=0), pulse1, pulse2, pulse3, and pulse4 are asserted forcing main_OUT1, main_OUT2, main_OUT3, and main_OUT4 to the logic low level. When enable is negated, main_OUT is also forced to the logic low level. When enable toggles to a logic high level at t0, pulse1, pulse2, pulse3, and pulse4 are negated and toggle to the logic low level. In contrast, pulse4 remains at the logic high level because main_OUT is at the logic high level and main_OUT2 is at the logic low level. At time t2, pulse4 is negated when the primary transition propagates to main_OUT2.

When pulse1 is deasserted and main_OUT is at the logic high level, operation of the ring oscillator 340 begins with a primary transition at main_OUT1 at time t1. In response to the propagation of the primary transition to main_OUT1 and because main_OUT3 is at a logic low level, pulse0 is asserted by the reset stage0 145. In response to assertion of pulse0, the output of stage0 135, main_OUT is driven to the logic low level to generate an opposing transition.

The primary transition is received as an input at the stage 130-2, and because pulse2 is deasserted, the primary transition propagates through the stage 130-2 to main_OUT2 which is driven to a logic high level. In response to the propagation of the primary transition to main_OUT2, pulse1 is asserted by the reset stage 170-1. In response to assertion of pulse1, the output of stage 130-1, main_OUT1 is driven to the logic low level to generate an opposing transition.

The primary transition is received as an input at the stage 130-3, and because pulse3 is deasserted, the primary transition propagates through the stage 130-3 to main_OUT3 which is driven to a logic high level. In response to the propagation of the primary transition to main_OUT3, pulse2 is asserted by the reset stage 170-2. In response to assertion of pulse2, the output of stage 130-2, main_OUT2 is driven to the logic low level to generate an opposing transition.

The primary transition is received as an input at the stage 130-4, and because pulse4 is deasserted, the primary transition propagates through the stage 130-4 to main_OUT4 which is driven to a logic high level. In response to the propagation of the primary transition to main_OUT4, pulse3 is asserted by the reset stage 170-3. In response to assertion of pulse3, the output of stage 130-3, main_OUT3 is driven to the logic low level to generate an opposing transition.

The primary transition is received as an input at the stage0 135, and because pulse0 is deasserted, the primary transition propagates through the stage0 135 to main_OUT which is driven to a logic high level. In response to the propagation of the primary transition to main_OUT, pulse4 is asserted by the reset stage 170-4. In response to assertion of pulse4, the output of stage 130-4, main_OUT4 is driven to the logic low level to generate an opposing transition. The primary transition is received as an input at the stage 130-1, and because pulse1 is deasserted, the primary transition propagates through the stage 130-1 to main_OUT1 which is driven to a logic high level again to repeat the oscillation cycle. A period and frequency of the ringoscillator 340 is measured as a time duration between successive primary transitions at an output of a particular stage, such as the stage 130-1.

Figure 4A:
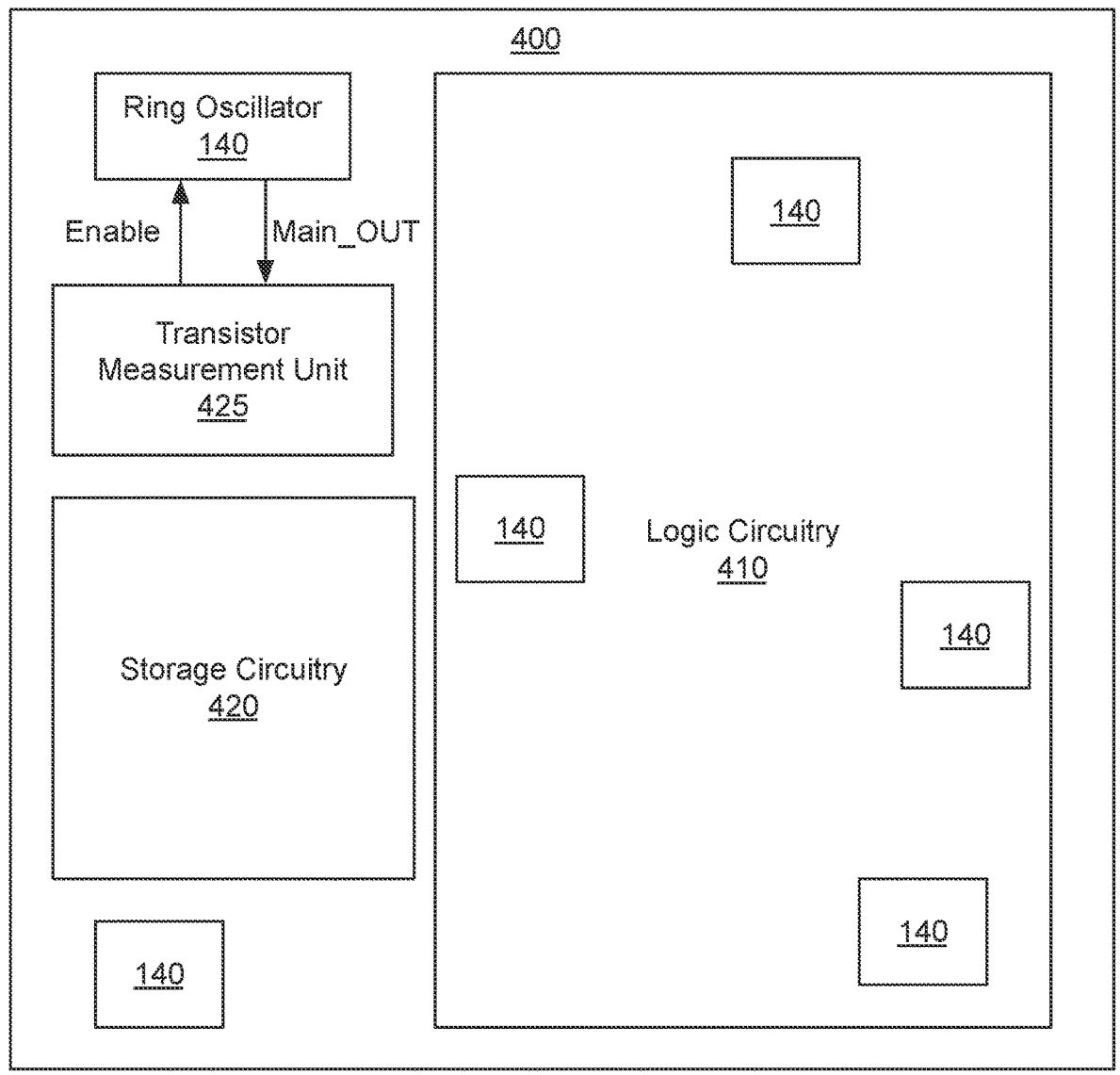
FIG. 4A illustrates a conceptual diagram of multiple silicon test structures fabricated in a silicon die suitable for use in implementing some embodiments of the present disclosure.

FIG. 4A illustrates a conceptual diagram of multiple silicon test structures fabricated in a silicon die 400 suitable for use in implementing some embodiments of the present disclosure. In an embodiment, a silicon test structure comprises the ring oscillators 140 and a transistor measurement unit 425. A first portion of the ring oscillators 140 comprises NMOS transistor dominant stages 105 and 100 and a second portion of the ring oscillators 140 comprises PMOS transistor dominant stages 105 and 100. The silicon die 400 also includes logic circuitry 410 and/or storage circuitry 420. In other embodiment, additional circuitry may be fabricated in the silicon die 400. The transistor measurement unit 425 initializes the ring oscillators and then enables one or more of the ring oscillators 140 to measure a frequency of the main_OUT signal output by each ring oscillator 140. The frequencies may be stored and/or processed by the transistor measurement unit 425 to provide multiple NMOS and PMOS transistor specific measurements.

Figure 4B:
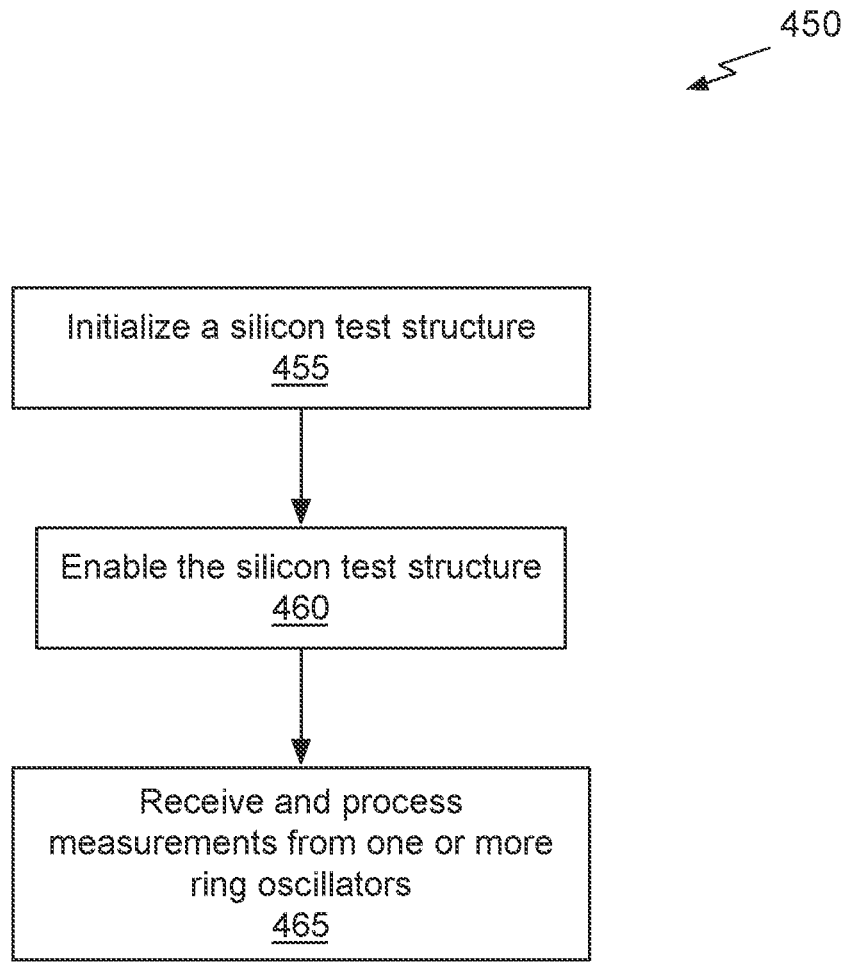
FIG. 4B illustrates a flowchart of a method for measuring transistor delays, in accordance with an embodiment.

FIG. 4B illustrates a flowchart of a method 450 for measuring transistor delays, in accordance with an embodiment. Each block of method 450, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 450 is described, by way of example, with respect to the ring oscillator 140 of FIG. 1D and the transistor measurement unit 425 of FIG. 4A. However, this method may additionally or alternatively be executed by any one system, or any combination of systems, including, but not limited to, those described herein. Furthermore, persons of ordinary skill in the art will understand that any system that performs method 450 is within the scope and spirit of embodiments of the present disclosure.

At step 455, a silicon test structure is initialized. In an embodiment, the transistor measurement unit 425 initializes the ring oscillators 140. In an embodiment, initialization comprises negating the enable signal. At step 460, the silicon test structure is enabled. In an embodiment, the transistor measurement unit 425 enables one or more of the ring oscillators 140 to operate.

At step 465, measurements from one or more ring oscillators are received and processed. In an embodiment, the transistor measurement unit 425 the main_OUT signal output by each ring oscillator 140 and measures a frequency of oscillation of each main_OUT signal. The frequencies may be stored and/or processed by the transistor measurement unit 425 to provide multiple NMOS and PMOS transistor specific measurements. For example, the frequencies may be processed to compute process-specific characteristics for transistors fabricated within the silicon die 400, such as silicon process corner data specific to the silicon die 400.

A ring oscillator constructed of a series of non-inverting stages. Each of the non-inverting stages generates either a rising or falling primary transition that is determined by either NMOS or PMOS transistors, respectively. The opposing transition for a particular non-inverting stage is triggered by propagation of the primary transition to a subsequent non-inverting stage (producing a "reset" pulse). A frequency of the ring oscillator is determined by the primary transition and one transistor type (NMOS or PMOS). Specifically, the frequency is determined by the propagation delay of the primary transition through the entire ring oscillator. In contrast, a frequency of a conventional ring oscillator is determined by both rising and falling transitions and both NMOS and PMOS transistor types. Additionally, a conventional oscillator includes an odd number of stages to produce an oscillating signal. In contrast, the ring oscillator constructed of non-inverting stages that are each sensitive to delays of either NMOS or PMOS transistors may include either an odd number of stages or an even number of stages. The ring oscillator is small in terms of a fabricated footprint and may be instantiated across a die to provide multiple NMOS and PMOS specific measurements.

The ability to separately measure the frequency due to either NMOS or PMOS transistors enables more accurate computation of silicon process corners. The silicon test structures described herein, enable measurement of the SF, FS and TT process corners and also provide mechanisms for identifying if the NMOS and PMOS transistor performances are off target. Identifying whether the NMOS and PMOS transistors are on or off performance targets is also important for silicon correlation and process binning.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5A:
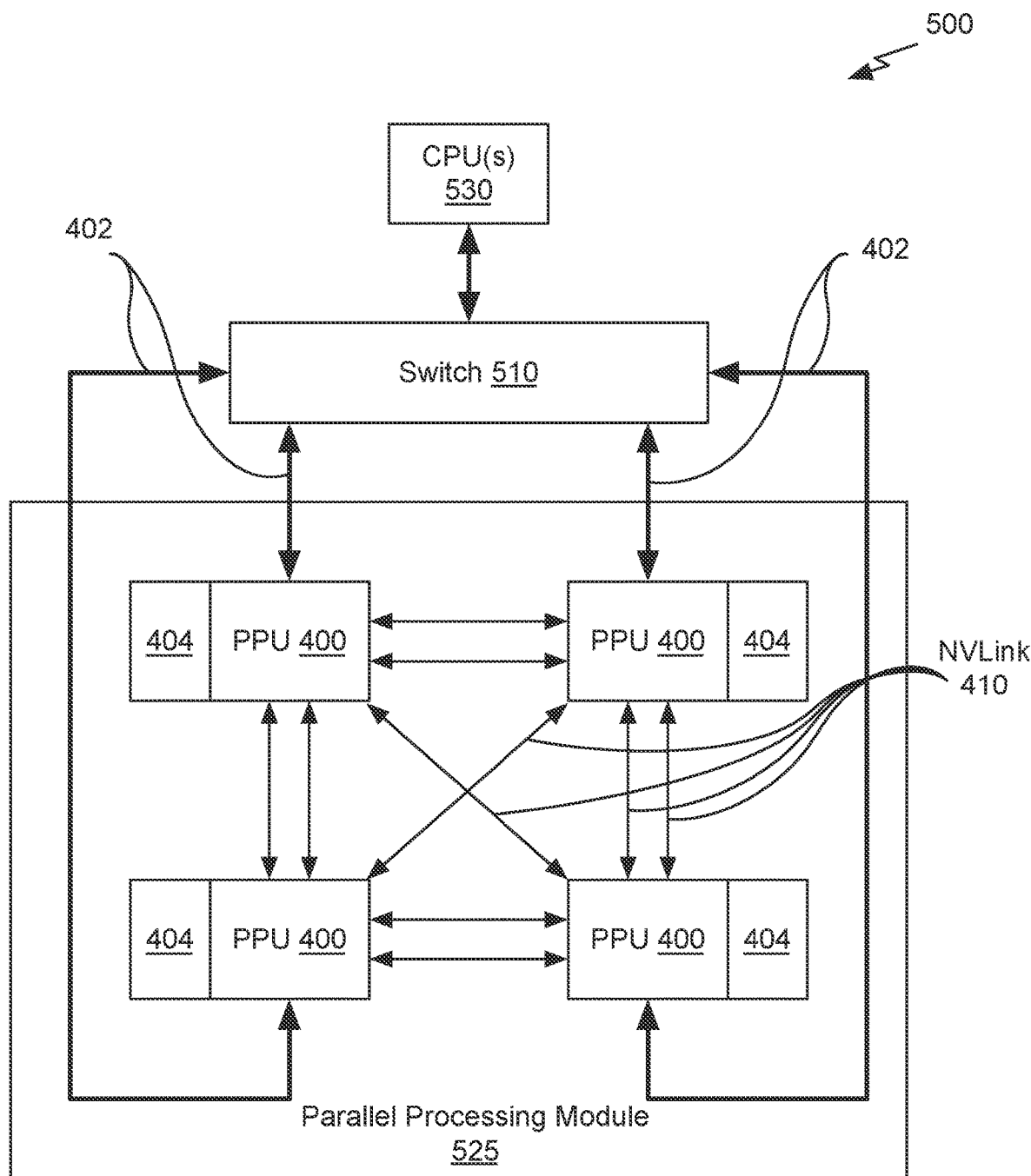
FIG. 5A is a conceptual diagram of a processing system in which the various architecture and/or functionality of the various previous embodiments may be implemented.

FIG. 5A is a conceptual diagram of a processing system 500, in accordance with an embodiment. The exemplary system 500 may be configured to implement the method 150 shown in FIG. 1C and/or the method 450 shown in FIG. 4B. The processing system 500 includes a CPU 530, switch 510, and multiple parallel processing units (PPUs) 400, and respective memories 404. The exemplary system 500 may be implemented in a silicon die that also includes a transistor measurement unit 320 and/or one or more ring oscillators 140.

Each PPU 400 may include hundreds or thousands of cores that are capable of handling hundreds or thousands of software threads simultaneously. The PPUs 400 may generate pixel data for output images in response to rendering commands (e.g., rendering commands from the CPU(s) 530 received via a host interface). The PPUs 400 may include graphics memory, such as display memory, for storing pixel data or any other suitable data, such as GPGPU data. The display memory may be included as part of the memory 404. The PPUs 400 may include two or more GPUs operating in parallel (e.g., via a link). The link may directly connect the GPUs (e.g., using NVLINK 410) or may connect the GPUs through a switch (e.g., using switch 510). When combined together, each PPU 400 may generate pixel data or GPGPU data for different portions of an output or for different outputs (e.g., a first PPU for a first image and a second PPU for a second image). Each PPU 400 may include its own memory 404, or may share memory with other PPUs 400.

The PPUs 400 may each include, and/or be configured to perform functions of, one or more processing cores and/or components thereof, such as Tensor Cores (TCs), Tensor Processing Units(TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

Figure 5B:
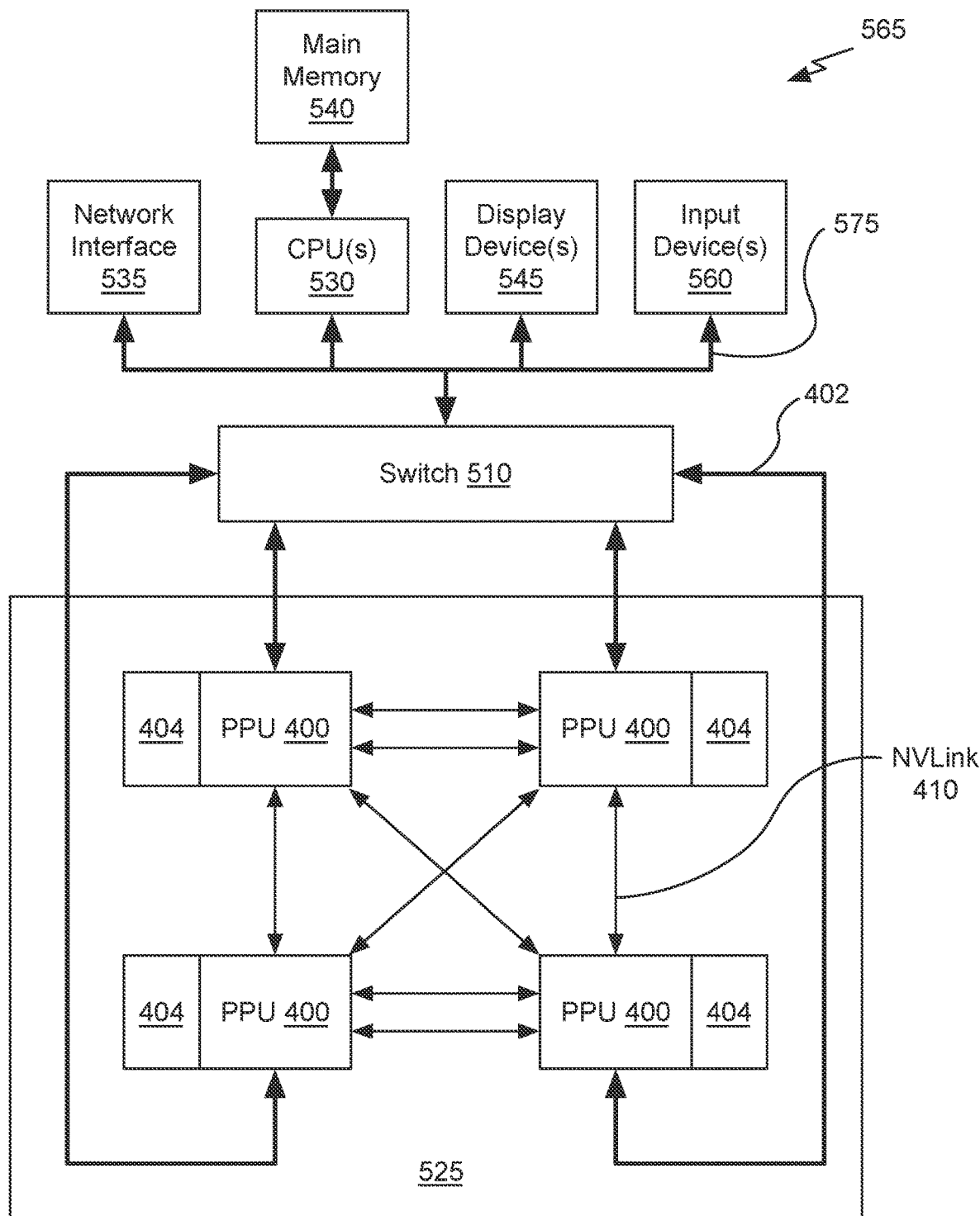
FIG. 5B illustrates an exemplary system in which the various architecture and/or functionality of the various previous embodiments may be implemented.

The NVLink 410 provides high-speed communication links between each of the PPUs 400. Although a particular number of NVLink 410 and interconnect 402 connections are illustrated in FIG. 5B, the number of connections to each PPU 400 and the CPU 530 may vary. The switch 510 interfaces between the interconnect 402 and the CPU 530. The PPUs 400, memories 404, and NVLinks 410 may be situated on a single semiconductor platform to form a parallel processing module 525. In an embodiment, the switch 510 supports two or more protocols to interface between various different connections and/or links.

In another embodiment (not shown), the NVLink 410 provides one or more high-speed communication links between each of the PPUs 400 and the CPU 530 and the switch 510 interfaces between the interconnect 402 and each of the PPUs 400. The PPUs 400, memories 404, and interconnect 402 may be situated on a single semiconductor platform to form a parallel processing module 525. In yet another embodiment (not shown), the interconnect 402 provides one or more communication links between each of the PPUs 400 and the CPU 530 and the switch 510 interfaces between each of the PPUs 400 using the NVLink 410 to provide one or more high-speed communication links between the PPUs 400. In another embodiment (not shown), the NVLink 410 provides one or more high-speed communication links between the PPUs 400 and the CPU 530 through the switch 510. In yet another embodiment (not shown), the interconnect 402 provides one or more communication links between each of the PPUs 400 directly. One or more of the NVLink 410 high-speed communication links may be implemented as a physical NVLink interconnect or either an on-chip or on-die interconnect using the same protocol as the NVLink 410.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 400 and/or memories 404 may be packaged devices. In an embodiment, the CPU 530, switch 510, and the parallel processing module 525 are situated on a single semiconductor platform.

In an embodiment, the signaling rate of each NVLink 410 is 20 to 25 Gigabits/second and each PPU 400 includes six NVLink 410 interfaces (as shown in FIG. 5A, five NVLink 410 interfaces are included for each PPU 400). Each NVLink 410 provides a data transfer rate of 25 Gigabytes/second in each direction, with six links providing 400 Gigabytes/second. The NVLinks 410 can be used exclusively for PPU-to-PPU communication as shown in FIG. 5A, or some combination of PPU-to-PPU and PPU-to-CPU, when the CPU 530 also includes one or more NVLink 410 interfaces.

In an embodiment, the NVLink 410 allows direct load/store/atomic access from the CPU 530 to each PPU's 400 memory 404. In an embodiment, the NVLink 410 supports coherency operations, allowing data read from the memories 404 to be stored in the cache hierarchy of the CPU 530, reducing cache access latency for the CPU 530. In an embodiment, the NVLink 410 includes support for Address Translation Services (ATS), allowing the PPU 400 to directly access page tables within the CPU 530. One or more of the NVLinks 410 may also be configured to operate in a low-power mode.

FIG. 5B illustrates an exemplary system 565 in which the various architecture and/or functionality of the various previous embodiments may be implemented. The exemplary system 565 may be configured to implement the 150 shown in FIG. 1C and/or the method 450 shown in FIG. 4B.

As shown, a system 565 is provided including at least one central processing unit 530 that is connected to a communication bus 575. The communication bus 575 may directly or indirectly couple one or more of the following devices: main memory 540, network interface 535, CPU(s) 530, display device(s) 545, input device(s) 560, switch 510, and parallel processing system 525. The communication bus 575 may be implemented using any suitable protocol and may represent one or more links or busses, such as an address bus, a data bus, a control bus, or a combination thereof. The communication bus 575 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, HyperTransport, and/or another type of bus or link. In some embodiments, there are direct connections between components. As an example, the CPU(s) 530 may be directly connected to the main memory 540. Further, the CPU(s) 530 may be directly connected to the parallel processing system 525. Where there is direct, or point-to-point connection between components, the communication bus 575 may include a PCIe link to carry out the connection. In these examples, a PCI bus need not be included in the system 565.

Although the various blocks of FIG. 5B are shown as connected via the communication bus 575 with lines, this is not intended to be limiting and is for clarity only. For example, in some embodiments, a presentation component, such as display device(s) 545, may be considered an I/O component, such as input device(s) 560 (e.g., if the display is a touch screen). As another example, the CPU(s) 530 and/or parallel processing system 525 may include memory (e.g., the main memory 540 may be representative of a storage device in addition to the parallel processing system 525, the CPUs 530, and/or other components). In other words, the computing device of FIG. 5B is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5B.

The system 565 also includes a main memory 540. Control logic (software) and data are stored in the main memory 540 which may take the form of a variety of computer-readable media. The computer-readable media may be any available media that may be accessed by the system 565. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the main memory 540 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by system 565. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

Computer programs, when executed, enable the system 565 to perform various functions. The CPU(s) 530 may be configured to execute at least some of the computer-readable instructions to control one or more components of the system 565 to perform one or more of the methods and/or processes described herein. The CPU(s) 530 may each include one or more cores (e.g., one, two, four, eight, twenty-eight, seventy-two, etc.) that are capable of handling a multitude of software threads simultaneously. The CPU(s) 530 may include any type of processor, and may include different types of processors depending on the type of system 565 implemented (e.g., processors with fewer cores for mobile devices and processors with more cores for servers). For example, depending on the type of system 565, the processor may be an Advanced RISC Machines (ARM) processor implemented using Reduced Instruction Set Computing (RISC) or an x86 processor implemented using Complex Instruction Set Computing (CISC). The system 565 may include one or more CPUs 530 in addition to one or more microprocessors or supplementary co-processors, such as math co-processors.

In addition to or alternatively from the CPU(s) 530, the parallel processing module 525 may be configured to execute at least some of the computer-readable instructions to control one or more components of the system 565 to perform one or more of the methods and/or processes described herein. The parallel processing module 525 may be used by the system 565 to render graphics (e.g., 3D graphics) or perform general purpose computations. For example, the parallel processing module 525 may be used for General-Purpose computing on GPUs (GPGPU). In embodiments, the CPU(s) 530 and/or the parallel processing module 525 may discretely or jointly perform any combination of the methods, processes and/or portions thereof.

The system 565 also includes input device(s) 560, the parallel processing system 525, and display device(s) 545. The display device(s) 545 may include a display (e.g., a monitor, a touch screen, a television screen, a heads-up-display (HUD), other display types, or a combination thereof), speakers, and/or other presentation components. The display device(s) 545 may receive data from other components (e.g., the parallel processing system 525, the CPU(s) 530, etc.), and output the data (e.g., as an image, video, sound, etc.).

The network interface 535 may enable the system 565 to be logically coupled to other devices including the input devices 560, the display device(s) 545, and/or other components, some of which may be built in to (e.g., integrated in) the system 565. Illustrative input devices 560 include a microphone, mouse, keyboard, joystick, game pad, game controller, satellite dish, scanner, printer, wireless device, etc. The input devices 560 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the system 565. The system 565 may be include depth cameras, such as stereoscopic camera systems, infrared camera systems, RGB camera systems, touchscreen technology, and combinations of these, for gesture detection and recognition. Additionally, the system 565 may include accelerometers or gyroscopes (e.g., as part of an inertia measurement unit (IMU)) that enable detection of motion. In some examples, the output of the accelerometers or gyroscopes may be used by the system 565 to render immersive augmented reality or virtual reality.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes. The system 565 may be included within a distributed network and/or cloud computing environment.

The network interface 535 may include one or more receivers, transmitters, and/or transceivers that enable the system 565 to communicate with other computing devices via an electronic communication network, included wired and/or wireless communications. The network interface 535 may be implemented as a network interface controller (NIC) that includes one or more data processing units (DPUs) to perform operations such as (for example and without limitation) packet parsing and accelerating network processing and communication. The network interface 535 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The system 565 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. The system 565 may also include a hard-wired power supply, a battery power supply, or a combination thereof (not shown). The power supply may provide power to the system 565 to enable the components of the system 565 to operate.

Each of the foregoing modules and/or devices may even be situated on a single semiconductor platform to form the system 565. Alternately, the various modules may also be situated separately or in various combinations of semiconductor platforms per the desires of the user. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the processing system 500 of FIG. 5A and/or exemplary system 565 of FIG. 5B—e.g., each device may include similar components, features, and/or functionality of the processing system 500 and/or exemplary system 565.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example processing system 500 of FIG. 5A and/or exemplary system 565 of FIG. 5B. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Machine Learning

Deep neural networks (DNNs) developed on processors, such as the PPU 400 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 400. Inferencing is less compute-intensive than training, being a latency-sensitive process where a trained neural network is applied to new inputs it has not seen before to classify images, detect emotions, identify recommendations, recognize and translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 400 is a computing platform capable of delivering performance required for deep neural network-based artificial intelligence and machine learning applications.

Furthermore, data generated applying one or more of the techniques disclosed herein may be used to train, test, or certify DNNs used to recognize objects and environments in the real world. Such data may include scenes of roadways, factories, buildings, urban settings, rural settings, humans, animals, and any other physical object or real-world setting. Such data may be used to train, test, or certify DNNs that are employed in machines or robots to manipulate, handle, or modify physical objects in the real world. Furthermore, such data may be used to train, test, or certify DNNs that are employed in autonomous vehicles to navigate and move the vehicles through the real world. Additionally, data generated applying one or more of the techniques disclosed herein may be used to convey information to users of such machines, robots, and vehicles.

Figure 5C:
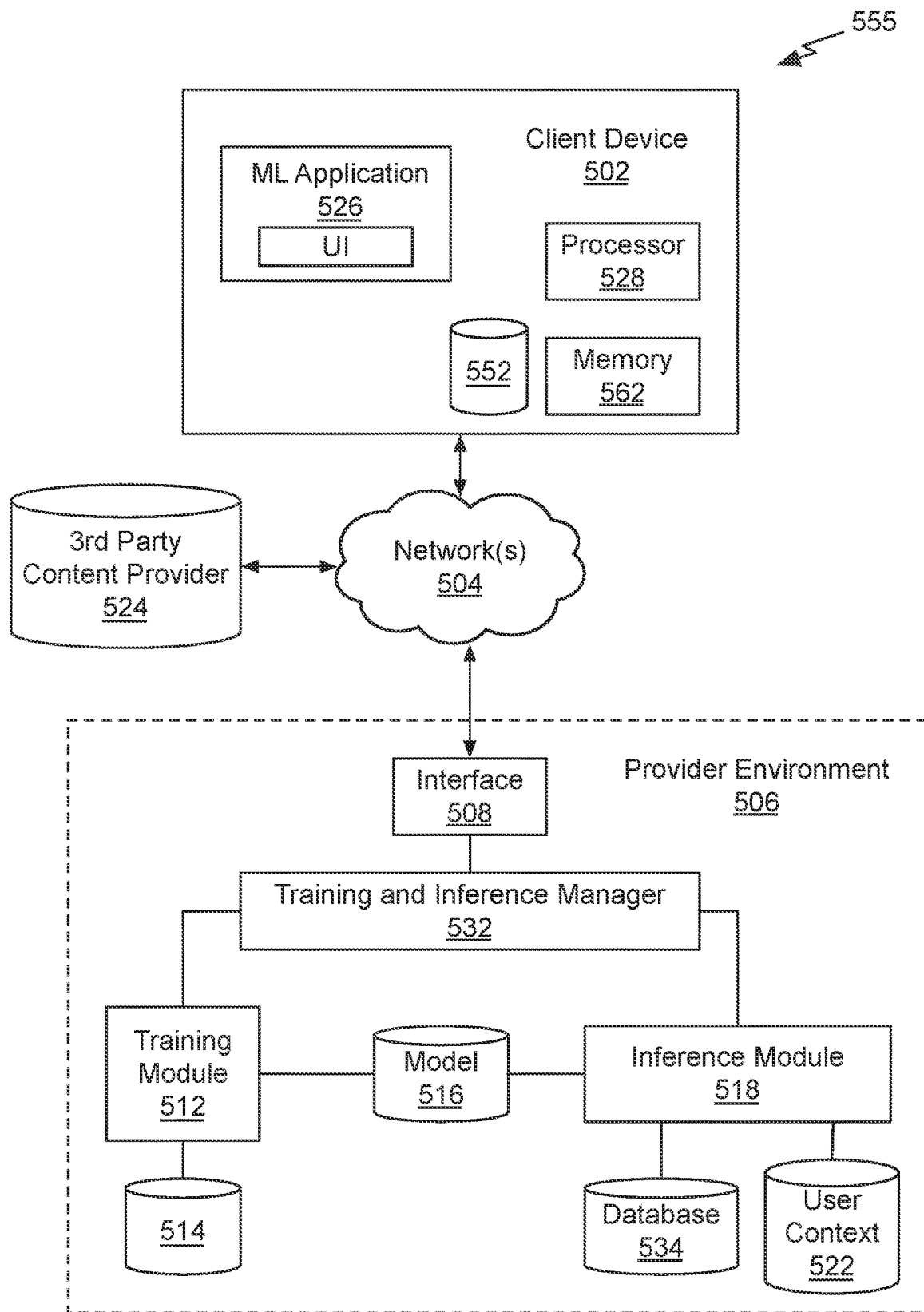
FIG. 5C illustrates components of an exemplary system that can be used to train and utilize machine learning, in at least one embodiment.

FIG. 5C illustrates components of an exemplary system 555 that can be used to train and utilize machine learning, in accordance with at least one embodiment. As will be discussed, various components can be provided by various combinations of computing devices and resources, or a single computing system, which may be under control of a single entity or multiple entities. Further, aspects may be triggered, initiated, or requested by different entities. In at least one embodiment training of a neural network might be instructed by a provider associated with provider environment 506, while in at least one embodiment training might be requested by a customer or other user having access to a provider environment through a client device 502 or other such resource. In at least one embodiment, training data (or data to be analyzed by a trained neural network) can be provided by a provider, a user, or a third party content provider 524. In at least one embodiment, client device 502 may be a vehicle or object that is to be navigated on behalf of a user, for example, which can submit requests and/or receive instructions that assist in navigation of a device.

In at least one embodiment, requests are able to be submitted across at least one network 504 to be received by a provider environment 506. In at least one embodiment, a client device may be any appropriate electronic and/or computing devices enabling a user to generate and send such requests, such as, but not limited to, desktop computers, notebook computers, computer servers, smartphones, tablet computers, gaming consoles (portable or otherwise), computer processors, computing logic, and set-top boxes. Network(s) 504 can include any appropriate network for transmitting a request or other such data, as may include Internet, an intranet, an Ethernet, a cellular network, a local area network (LAN), a wide area network (WAN), a personal area network (PAN), an ad hoc network of direct wireless connections among peers, and so on.

In at least one embodiment, requests can be received at an interface layer 508, which can forward data to a training and inference manager 532, in this example. The training and inference manager 532 can be a system or service including hardware and software for managing requests and service corresponding data or content, in at least one embodiment, the training and inference manager 532 can receive a request to train a neural network, and can provide data for a request to a training module 512. In at least one embodiment, training module 512 can select an appropriate model or neural network to be used, if not specified by the request, and can train a model using relevant training data. In at least one embodiment, training data can be a batch of data stored in a training data repository 514, received from client device 502, or obtained from a third party provider 524. In at least one embodiment, training module 512 can be responsible for training data. A neural network can be any appropriate network, such as a recurrent neural network (RNN) or convolutional neural network (CNN). Once a neural network is trained and successfully evaluated, a trained neural network can be stored in a model repository 516, for example, that may store different models or networks for users, applications, or services, etc. In at least one embodiment, there may be multiple models for a single application or entity, as may be utilized based on a number of different factors.

In at least one embodiment, at a subsequent point in time, a request may be received from client device 502 (or another such device) for content (e.g., path determinations) or data that is at least partially determined or impacted by a trained neural network. This request can include, for example, input data to be processed using a neural network to obtain one or more inferences or other output values, classifications, or predictions, or for at least one embodiment, input data can be received by interface layer 508 and directed to inference module 518, although a different system or service can be used as well. In at least one embodiment, inference module 518 can obtain an appropriate trained network, such as a trained deep neural network (DNN) as discussed herein, from model repository 516 if not already stored locally to inference module 518. Inference module 518 can provide data as input to a trained network, which can then generate one or more inferences as output. This may include, for example, a classification of an instance of input data. In at least one embodiment, inferences can then be transmitted to client device 502 for display or other communication to a user. In at least one embodiment, context data for a user may also be stored to a user context data repository 522, which may include data about a user which may be useful as input to a network in generating inferences, or determining data to return to a user after obtaining instances. In at least one embodiment, relevant data, which may include at least some of input or inference data, may also be stored to a local database 534 for processing future requests. In at least one embodiment, a user can use account information or other information to access resources or functionality of a provider environment. In at least one embodiment, if permitted and available, user data may also be collected and used to further train models, in order to provide more accurate inferences for future requests. In at least one embodiment, requests may be received through a user interface to a machine learning application 526 executing on client device 502, and results displayed through a same interface. A client device can include resources such as a processor 528 and memory 562 for generating a request and processing results or a response, as well as at least one data storage element 552 for storing data for machine learning application 526.

In at least one embodiment a processor 528 (or a processor of training module 512 or inference module 518) will be a central processing unit (CPU). As mentioned, however, resources in such environments can utilize GPUs to process data for at least certain types of requests. With thousands of cores, GPUs, such as PPU 400 are designed to handle substantial parallel workloads and, therefore, have become popular in deep learning for training neural networks and generating predictions. While use of GPUs for offline builds has enabled faster training of larger and more complex models, generating predictions offline implies that either request-time input features cannot be used or predictions must be generated for all permutations of features and stored in a lookup table to serve real-time requests. If a deep learning framework supports a CPU-mode and a model is small and simple enough to perform a feed-forward on a CPU with a reasonable latency, then a service on a CPU instance could host a model. In this case, training can be done offline on a GPU and inference done in real-time on a CPU. If a CPU approach is not viable, then a service can run on a GPU instance. Because GPUs have different performance and cost characteristics than CPUs, however, running a service that offloads a runtime algorithm to a GPU can require it to be designed differently from a CPU based service.

In at least one embodiment, video data can be provided from client device 502 for enhancement in provider environment 506. In at least one embodiment, video data can be processed for enhancement on client device 502. In at least one embodiment, video data may be streamed from a third party content provider 524 and enhanced by third party content provider 524, provider environment 506, or client device 502. In at least one embodiment, video data can be provided from client device 502 for use as training data in provider environment 506.

In at least one embodiment, supervised and/or unsupervised training can be performed by the client device 502 and/or the provider environment 506. In at least one embodiment, a set of training data 514 (e.g., classified or labeled data) is provided as input to function as training data. In at least one embodiment, training data can include instances of at least one type of object for which a neural network is to be trained, as well as information that identifies that type of object. In at least one embodiment, training data might include a set of images that each includes a representation of a type of object, where each image also includes, or is associated with, a label, metadata, classification, or other piece of information identifying a type of object represented in a respective image. Various other types of data may be used as training data as well, as may include text data, audio data, video data, and so on. In at least one embodiment, training data 514 is provided as training input to a training module 512. In at least one embodiment, training module 512 can be a system or service that includes hardware and software, such as one or more computing devices executing a training application, for training a neural network (or other model or algorithm, etc.). In at least one embodiment, training module 512 receives an instruction or request indicating a type of model to be used for training, in at least one embodiment, a model can be any appropriate statistical model, network, or algorithm useful for such purposes, as may include an artificial neural network, deep learning algorithm, learning classifier, Bayesian network, and so on. In at least one embodiment, training module 512 can select an initial model, or other untrained model, from an appropriate repository 516 and utilize training data 514 to train a model, thereby generating a trained model (e.g., trained deep neural network) that can be used to classify similar types of data, or generate other such inferences. In at least one embodiment where training data is not used, an appropriate initial model can still be selected for training on input data per training module 512.

In at least one embodiment, a model can be trained in a number of different ways, as may depend in part upon a type of model selected. In at least one embodiment, a machine learning algorithm can be provided with a set of training data, where a model is a model artifact created by a training process. In at least one embodiment, each instance of training data contains a correct answer (e.g., classification), which can be referred to as a target or target attribute. In at least one embodiment, a learning algorithm finds patterns in training data that map input data attributes to a target, an answer to be predicted, and a machine learning model is output that captures these patterns. In at least one embodiment, a machine learning model can then be used to obtain predictions on new data for which a target is not specified.

In at least one embodiment, training and inference manager 532 can select from a set of machine learning models including binary classification, multiclass classification, generative, and regression models. In at least one embodiment, a type of model to be used can depend at least in part upon a type of target to be predicted.

Example Streaming System

Figure 6:
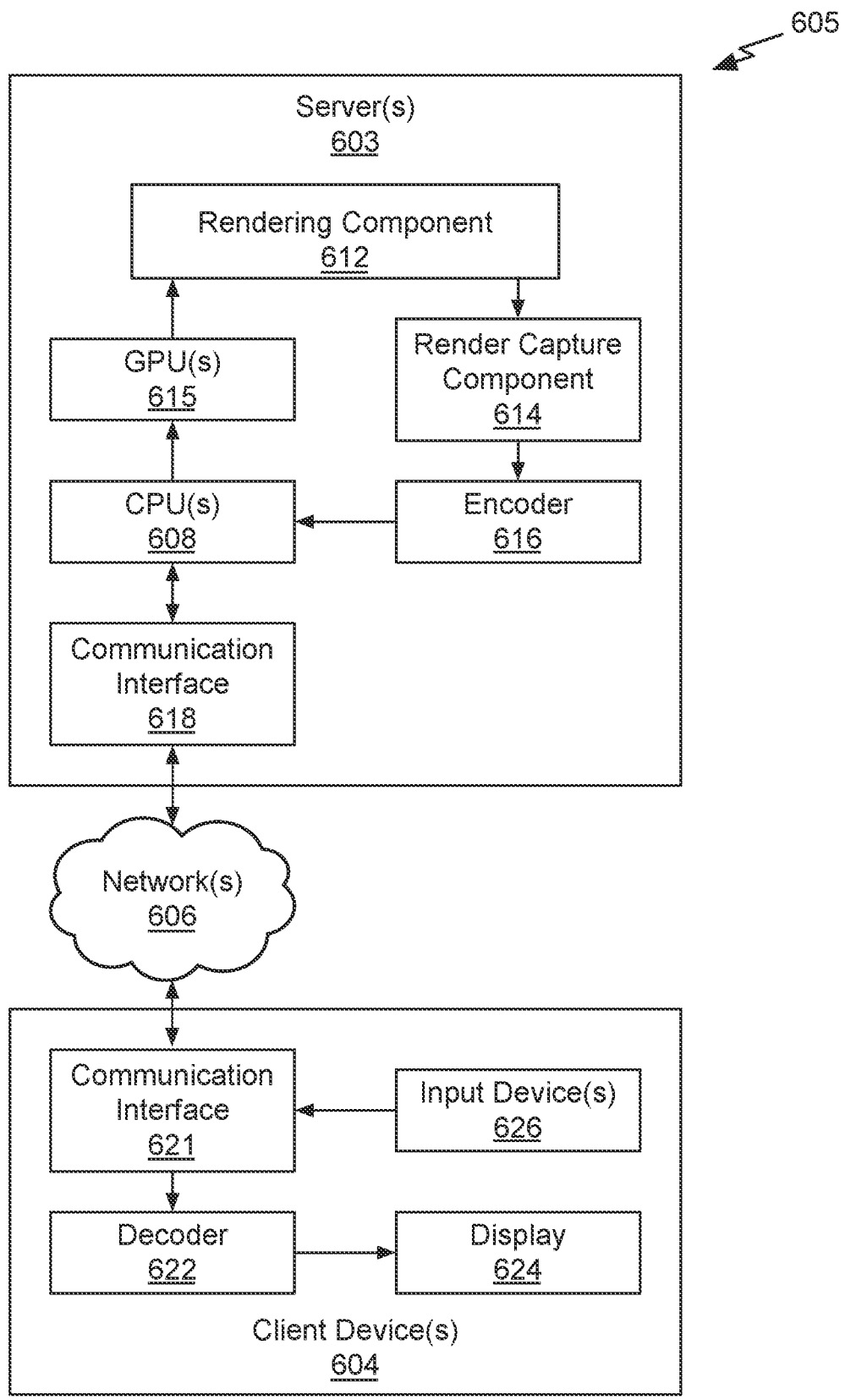
FIG. 6 illustrates an exemplary streaming system suitable for use in implementing some embodiments of the present disclosure.

FIG. 6 is an example system diagram for a streaming system 605, in accordance with some embodiments of the present disclosure. FIG. 6 includes server(s) 603 (which may include similar components, features, and/or functionality to the example processing system 500 of FIG. 5A and/or exemplary system 565 of FIG. 5B), client device(s) 604 (which may include similar components, features, and/or functionality to the example processing system 500 of FIG. 5A and/or exemplary system 565 of FIG. 5B), and network(s) 606 (which may be similar to the network(s) described herein). In some embodiments of the present disclosure, the system 605 may be implemented.

In an embodiment, the streaming system 605 is a game streaming system and the sever(s) 604 are game server(s). In the system 605, for a game session, the client device(s) 604 may only receive input data in response to inputs to the input device(s) 626, transmit the input data to the server(s) 603, receive encoded display data from the server(s) 603, and display the display data on the display 624. As such, the more computationally intense computing and processing is offloaded to the server(s) 603 (e.g., rendering—in particular ray or path tracing—for graphical output of the game session is executed by the GPU(s) 615 of the server(s) 603). In other words, the game session is streamed to the client device(s) 604 from the server(s) 603, thereby reducing the requirements of the client device(s) 604 for graphics processing and rendering.

For example, with respect to an instantiation of a game session, a client device 604 may be displaying a frame of the game session on the display 624 based on receiving the display data from the server(s) 603. The client device 604 may receive an input to one of the input device(s) 626 and generate input data in response. The client device 604 may transmit the input data to the server(s) 603 via the communication interface 621 and over the network(s) 606 (e.g., the Internet), and the server(s) 603 may receive the input data via the communication interface 618. The CPU(s) 608 may receive the input data, process the input data, and transmit data to the GPU(s) 615 that causes the GPU(s) 615 to generate a rendering of the game session. For example, the input data may be representative of a movement of a character of the user in a game, firing a weapon, reloading, passing a ball, turning a vehicle, etc. The rendering component 612 may render the game session (e.g., representative of the result of the input data) and the render capture component 614 may capture the rendering of the game session as display data (e.g., as image data capturing the rendered frame of the game session). The rendering of the game session may include ray or path-traced lighting and/or shadow effects, computed using one or more parallel processing units—such as GPUs, which may further employ the use of one or more dedicated hardware accelerators or processing cores to perform ray or path-tracing techniques—of the server(s) 603. The encoder 616 may then encode the display data to generate encoded display data and the encoded display data may be transmitted to the client device 604 over the network(s) 606 via the communication interface 618. The client device 604 may receive the encoded display data via the communication interface 621 and the decoder 622 may decode the encoded display data to generate the display data. The client device 604 may then display the display data via the display 624.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B")

is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method, comprising:
   receiving a primary transition that is either rising or falling at an input to a first non-inverting stage of a ring oscillator that includes the first non-inverting stage coupled in series with at least one additional non-inverting stage;
   propagating, by the first non-inverting stage, the primary transition from an output of the first non-inverting stage to the at least one additional non-inverting stage, wherein when the primary transition is a rising transition an opposing transition is a falling transition; and
   in response to arrival of the primary transition at a second non-inverting stage included in the at least one additional non-inverting stage, generating a pulse that is asserted for a time duration starting at a first transition and the pulse is negated at an end of the time duration, wherein the first transition causes the first non-inverting stage to generate the opposing transition that is propagated from the output to the at least one additional non-inverting stage.

2. The computer-implemented method of claim 1, wherein the primary transition is a rising transition having a duration that is determined by only NMOS transistors.

3. The computer-implemented method of claim 1, wherein the primary transition is a falling transition having a duration that is determined by only PMOS transistors.

4. The computer-implemented method of claim 1, wherein a number of the at least one additional non-inverting stage is even.

5. The computer-implemented method of claim 1, wherein a number of the at least one additional non-inverting stage is odd.

6. The computer-implemented method of claim 1, wherein a frequency of the ring oscillator indicates a die-specific delay corresponding to either NMOS or PMOS transistors.

7. The computer-implemented method of claim 1, wherein the time duration of the pulse is based on a propagation delay of the primary transition from the second non-inverting stage to a third non-inverting stage that is included in the at least one additional non-inverting stage.

8. The computer-implemented method of claim 1, further comprising measuring a frequency of the primary transition at the output of the first non-inverting stage of the ring oscillator to compute process-specific characteristics for transistors fabricated within a die.

9. The computer-implemented method of claim 8, wherein additional ring oscillators are included at additional locations within the die, and further comprising measuring additional frequencies of primary transitions of the additional ring oscillators to compute process-specific characteristics for transistors fabricated at the additional locations within the die.

10. The computer-implemented method of claim 1, wherein the opposing transition transitions from a first logic level to a second logic level and further comprising, in response to negation of the pulse, maintaining the second logic level until a subsequent primary transition is received at the input without actively driving the output to the second logic level.

11. A ring oscillator circuit, comprising:
    a plurality of non-inverting stages coupled in series to produce a signal having a frequency determined by only NMOS transistors or only PMOS transistors, wherein a primary transition that is either rising or falling is propagated through each non-inverting stage included in the plurality of non-inverting stages to produce the signal; and
    a plurality of reset stages that each cause an opposing transition at an output of a corresponding non-inverting stage included in the plurality of non-inverting stages in response to the primary transition at a different non-inverting stage included in the plurality of non-inverting stages that is downstream relative to the corresponding non-inverting stage.

12. The ring oscillator circuit of claim 11, wherein the primary transition is a rising transition having a duration that is determined by only NMOS transistors.

13. The ring oscillator circuit of claim 11, wherein the primary transition is a falling transition having a duration that is determined by only PMOS transistors.

14. The ring oscillator circuit of claim 11, wherein the plurality of non-inverting stages is an even number of non-inverting stages.

15. The ring oscillator circuit of claim 11, wherein the plurality of non-inverting stages is an odd number of non-inverting stages.

16. The ring oscillator circuit of claim 11, wherein each reset stage in the plurality of reset stages generates a pulse that causes the opposing transition at the output of the corresponding non-inverting stage.

17. The ring oscillator circuit of claim 16, wherein a duration of the pulse is based on a propagation delay of the primary transition from a first non-inverting stage to a second non-inverting stage included in the plurality of non-inverting stages.

18. The ring oscillator circuit of claim 11, wherein the ring oscillator is fabricated within a die and further comprising measuring the frequency of the signal at the output of a first non-inverting stage in the plurality of non-inverting stages to compute process-specific characteristics for transistors.

19. The ring oscillator circuit of claim 18, wherein additional ring oscillators are fabricated at additional locations within the die, and further comprising additional frequencies of signals produced by the additional ring oscillators are measured to compute process-specific characteristics for transistors fabricated at the additional locations.

20. A ring oscillator circuit, comprising:
    a first non-inverting stage coupled in series with a second and a third non-inverting stage to form a ring, wherein a primary transition at an output of the first non-inverting stage that is either rising or falling is propagated through each non-inverting stage in the ring; and a reset stage that causes an opposing transition at the output in response to the primary transition at the second non-inverting stage.

21. The ring oscillator circuit of claim 20, wherein a frequency of the ring oscillator indicates a die-specific delay corresponding to either NMOS or PMOS transistors.

22. The ring oscillator circuit of claim 20, wherein a frequency of the primary transition at the output of the first non-inverting stage of the ring oscillator circuit is measured to compute process-specific characteristics for transistors fabricated within a die.

23. A ring oscillator circuit, comprising:
   a first non-inverting stage having an input and an output;
   a second non-inverting stage having an input coupled to the output of the first non-inverting stage and further having an output;
   a third non-inverting stage having an input coupled to the output of the second non-inverting stage and further having an output; and
   a reset stage coupled to cause an opposing transition at the output of the first non-inverting stage in response to a primary transition at the output of the second non-inverting stage.

24. The ring oscillator circuit of claim 23, wherein a frequency of the ring oscillator indicates a die-specific delay corresponding to either NMOS or PMOS transistors.

25. The ring oscillator circuit of claim 23, wherein a frequency of the primary transition at the output of the first non-inverting stage of the ring oscillator circuit is measured to compute process-specific characteristics for transistors fabricated within a die.

* * * * *